US010762942B1

(12) United States Patent
Katti

(10) Patent No.: US 10,762,942 B1
(45) Date of Patent: Sep. 1, 2020

(54) MAGNETO-RESISTIVE RANDOM ACCESS MEMORY CELL WITH SPIN-DEPENDENT DIFFUSION AND STATE TRANSFER

(71) Applicant: Honeywell International Inc., Morris Plains, NJ (US)

(72) Inventor: Romney R. Katti, Shorewood, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/443,729

(22) Filed: Jun. 17, 2019

Related U.S. Application Data

(60) Provisional application No. 62/826,490, filed on Mar. 29, 2019.

(51) Int. Cl.
| G11C 11/00 | (2006.01) |
| G11C 11/16 | (2006.01) |
| H01L 43/06 | (2006.01) |
| H01L 43/04 | (2006.01) |

(52) U.S. Cl.
CPC ........ *G11C 11/1675* (2013.01); *G11C 11/161* (2013.01); *G11C 11/1673* (2013.01); *H01L 43/04* (2013.01); *H01L 43/065* (2013.01)

(58) Field of Classification Search
CPC .............. G11C 11/1675; G11C 11/161; G11C 11/1673; H01L 43/065; H01L 43/04
See application file for complete search history.

(56) References Cited

U.S. PATENT DOCUMENTS

| 7,839,675 | B2 | 11/2010 | Koo et al. |
| 8,889,433 | B2 | 11/2014 | De Brosse et al. |
| 8,902,641 | B2 | 12/2014 | Chih et al. |
| 9,105,832 | B2 | 8/2015 | Buhrman et al. |
| 9,281,467 | B2 | 3/2016 | Manipatruni et al. |
| 9,300,295 | B1 | 3/2016 | Zhang et al. |

(Continued)

FOREIGN PATENT DOCUMENTS

WO 2017/052622 A1 3/2017

OTHER PUBLICATIONS

Vignale, "Ten Years of Spin Hall Effect," Journal of Superconductivity and Novel Magnetism, Springer US, Jan. 2010, 8 pp.

(Continued)

*Primary Examiner* — Gene N Auduong
(74) *Attorney, Agent, or Firm* — Shumaker & Sieffert, P.A.

(57) ABSTRACT

An example device for performing a write operation using a spintronic Hall effect includes a Spin Hall Effect (SHE) structure, a Magnetic Tunnel Junction (MTJ) element, and processing circuitry. The MTJ element includes a free structure, a pinned structure, and a tunnel barrier arranged between the free structure and the pinned structure. The free structure comprises a plurality of free layers. The free structure is arranged with the SHE structure such that current in the SHE structure induces spin transfer into the free structure. The processing circuitry is configured to receive an instruction to set the MTJ element to a target state of a plurality of states and in response to receiving the instruction, generate electrical current through the spin Hall effect structure to modify a resistance of the MTJ element to correspond to the target state.

20 Claims, 15 Drawing Sheets

(56) References Cited

U.S. PATENT DOCUMENTS

| | | | |
|---|---|---|---|
| 9,530,478 | B2 | 12/2016 | Pi et al. |
| 9,620,188 | B2 | 4/2017 | Manipatruni et al. |
| 9,691,458 | B2 | 6/2017 | Ralph et al. |
| 10,460,785 | B1 * | 10/2019 | Lee ..................... G11C 11/1653 |
| 2015/0213867 | A1 | 7/2015 | Wu et al. |
| 2016/0196860 | A1 * | 7/2016 | Buhrman .............. H01L 27/228 365/158 |
| 2018/0061467 | A1 | 3/2018 | Kan et al. |
| 2018/0308536 | A1 * | 10/2018 | Buhrman ............ G11C 11/1675 |
| 2019/0006416 | A1 | 1/2019 | Lee et al. |

OTHER PUBLICATIONS

Dyakonov, "Spin Hall Effect," Spin Physics in Semiconductors, Springer Series in Solid-State Sciences, vol. 157, Sep. 4, 2008, 12 pp.

Ahmed et al., "A Comparative Study Between Spin-Transfer-Torque and Spin-Hall-Effect Switching Mechanisms in PMTJ Using SPICE," IEEE Journal on Exploratory Solid-State Computational Devices and Circuits, Nov. 20, 2017, 9 pp.

* cited by examiner

MAGNETO-RESISTIVE RANDOM ACCESS MEMORY CELL WITH SPIN-DEPENDENT DIFFUSION AND STATE TRANSFER

PRIORITY CLAIM

This application claims the benefit of U.S. Provisional Patent Application No. 62/826,490, filed Mar. 29, 2019, the entire content of which is incorporated herein by reference.

TECHNICAL FIELD

This disclosure relates to memory devices and, more specifically, to spintronic-based memory devices that are configured use a spin Hall effect.

BACKGROUND

Most modern electronic devices include a power source, components for storing data, components for processing data, components for receiving user input, and components for delivering user output. It is desirable for such electronic devices to have long battery life, powerful processing capabilities, and large amounts of data storage, but at the same time, it is also desirable for electronic devices to maintain small and lightweight form factors. To meet these conflicting demands, it is desirable for the components of these devices to become smaller with better performance.

It is generally desirable for memory components, for example, to store more data in a smaller space with faster read and write operations. Current types of non-volatile memory include electro-mechanical hard drives where read/write heads read and write data from and to a series of rotating disks. Other types of non-volatile memory include solid state memories that use transistors and other devices (e.g., capacitors, floating gate MOSFETs, etc.) to store data without any moving parts and with faster read and write access.

SUMMARY

This disclosure generally describes techniques for a memory device that uses the spin Hall effect to write to a free structure of a Magnetic Tunnel Junction (MTJ) element for read-back.

In one example, a device for performing a write operation using a spintronic Hall effect includes a Spin Hall Effect (SHE) structure; an MTJ element, the MTJ element comprising a free structure, a pinned structure, and a tunnel barrier arranged between the free structure and the pinned structure, wherein the free structure comprises a plurality of free layers and wherein the free structure is arranged with the SHE structure such that current in the SHE structure induces spin transfer into the free structure; and processing circuitry configured to: receive an instruction to set the MTJ element to a target state of a plurality of states; and in response to receiving the instruction, generate electrical current through the SHE structure to modify a resistance of the MTJ element to correspond to the target state.

In another example, a method for performing a write operation using a spintronic Hall effect includes receiving, by processing circuitry, an instruction to set an MTJ element to a target state of a plurality of states, the MTJ element comprising a free structure, a pinned structure, and a tunnel barrier arranged between the free structure and the pinned structure, wherein the free structure comprises a plurality of free layers and wherein the free structure is arranged with the SHE structure such that current in the SHE structure induces spin transfer into the free structure; and in response to receiving the instruction, generating, by processing circuitry, electrical current through the spin Hall effect structure to modify a resistance of the MTJ element to correspond to the target state.

In another example, a device for performing a write operation includes means for receiving an instruction to set an MTJ element to a target state of a plurality of states, the MTJ element comprising a free structure, a pinned structure, and a tunnel barrier arranged between the free structure and the pinned structure, wherein the free structure comprises a plurality of free layers and wherein the free structure is arranged with the SHE structure such that current in the SHE structure induces spin transfer into the free structure; and means for generating electrical current through the spin Hall effect structure to modify a resistance of the MTJ element to correspond to the target state in response to receiving the instruction.

The details of one or more aspects of the disclosure are set forth in the accompanying drawings and the description below. Other features, objects, and advantages of the devices, systems, methods, and techniques described in this disclosure will be apparent from the description and drawings, and from the claims.

DETAILED DESCRIPTION

Some applications have been identified in which memory devices, memory components/parts, and architectures may need to be radiation-hardened, offer non-volatility, and/or include magnetically-based devices that can be integrated monolithically or in multi-chip modules. Magneto-Resistive Random Access Memory (MRAM) is robust, has high endurance, has high data retention performance, and is scalable. These characteristics can be tailored for applications. Magnetic/spintronic memory devices are expected to provide desired non-volatile (and volatile) memory and data storage characteristics; including providing scalability, high endurance, and high data retention performance. These characteristics can be optimized for applications. Magnetic/spintronic memory devices may offer materials and technological similarity and compatibility with MRAM bits and other sensing devices such as accelerometers, gyros, and pressure sensors, which may support integration, modularity, miniaturization, and packaging with embedded MRAM and Application Specific Integrated Circuits (ASICs).

In accordance with one or more techniques described herein, circuitry may be constructed to include a memory device (e.g., MRAM bit cell and/or Magnetic Tunnel Junction (MTJ) element) with a structure and geometry that uses spin-dependent diffusion, spin-orbit coupling, and spin transfer to write to a free structure (FL/FL) structure and uses an MTJ element (with Tunneling Magneto-Resistive (TMR) sensing, or alternatively, Giant Magneto-Resistive (GMR) sensing or Anisotropic Magneto-Resistive (AMR) sensing) structure for read-back.

For example, circuitry may include a Spin Hall Effect (SHE) structure in proximity with an MTJ element that detects and supports a read-out (e.g., using spin diffusion and spin transfer for writing), with associated electronics and with desired, resistance, resistance-area product, and dimensions. Anisotropic, giant, and/or tunneling magneto-resistive effects may be used for sensing and readback. Processing circuitry may be configured to sense the spin Hall effect and spin ordering (e.g., induced by spin diffusion and spin-orbit torque, Spin Orbit Torque (SOT), processes) with high-sensitivity and high-signal magnetoresistance, beyond low-capacitance signals.

Such magnetic/spintronic memory devices may provide unique and desired application functionality, customization prospects, and environmental capability (e.g., shock, vibration, radiation, acceleration, motion) for various environments. Such magnetic/spintronic memory devices may offer materials and technological similarity and compatibility with sensing devices such as accelerometers, gyros, and pressure sensors, which may support integration, modularity, miniaturization, and packaging with embedded MRAM and ASICS. In some examples, the spintronic-based memory device described herein may be used for die-to-die or monolithic integration with MTJ elements/MTJ element die.

Figure 1:
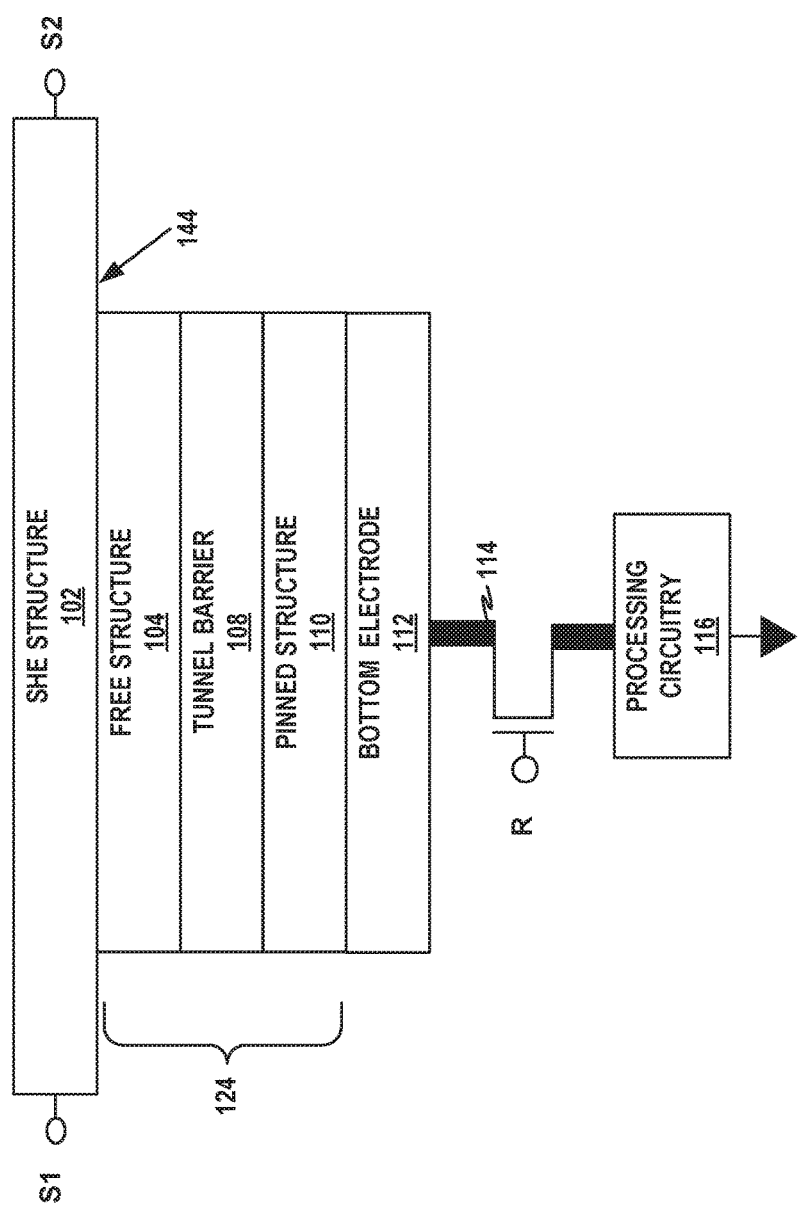
FIG. 1 shows a conceptual illustration of a first Spin Hall Effect (SHE) device configured to perform a write operation using a spin Hall effect.

FIG. 1 shows a conceptual illustration of a first SHE device 100 configured to perform a write operation using a spin Hall effect. SHE device 100 includes SHE structure 102, free structure 104, tunnel barrier 108, pinned structure 110, bottom electrode 112, switching element 114, and processing circuitry 116. In this disclosure, a "layer" may include a set of one or more structures (which may also be referred to herein as "sub-structures") and/or a set of one or more layers (which may also be referred to herein as "sub-layers") and a "structure" may similarly include a set of one or more structures (which may also be referred to herein as "sub-structures") and/or a set of one or more layers (which may also be referred to herein as "sub-layers"). However, for clarity, structure is generally used herein to refer to a set of one or more layers and a layer is generally used herein to refer to a portion within a structure. A shape of components of SHE device 100 may be varied to address and to optimize for performance. Materials of components of SHE device 100 may be varied to address and to optimize for performance.

SHE structure 102 may be formed of an antiferromagnetic material such as, for example, but not limited to, platinum manganese (PtMn), iron manganese (FeMn), iridium manganese (IrMn), palladium manganese (PdMn), or another antiferromagnetic material. As shown, SHE structure 102 may include a first node (S1) and a second node (S2) for receiving current (e.g., from a current source). In some examples, processing circuitry 116 may apply bipolar current to SHE structure 102. A geometry of SHE structure 102 may be forked, split, and/or recombined.

MTJ element 124 includes free structure 104, tunnel barrier 108, and a pinned structure 110. Free structure 104 may include multiple free layers (e.g., see FIGS. 11 and 12). Free structure 104 may include a magnetization direction that is free to switch between a parallel orientation and an antiparallel orientation. Tunnel barrier 108 includes a non-magnetic metal that separates free structure 104 and pinned structure 110. In some examples, tunnel barrier 108 may be formed of aluminum oxide, magnesium oxide, or another material. Pinned structure 110 may include a magnetization direction that is fixed or "pinned" to a single orientation. For example, pinned structure 110 may be pinned in a parallel orientation. In other examples, pinned structure 110 may be pinned in an antiparallel orientation. In the example of FIG. 1, pinned structure 110 may include an anti-ferromagnetic layer, such that the magnetization direction of the pinned structure 110 is "pinned" in a particular orientation the magnetization direction of the pinned structure 110 remains relatively fixed when operational magnetic fields are applied to MTJ element 124.

Bottom electrode 112 may be formed of a conductive material to permit a connection to MTJ element 124. Examples of conductive materials may include, but are not limited to, copper. In the example of FIG. 1, free structure 104 is arranged with a bottom surface 144 of SHE structure 102. As shown, in this example, tunnel barrier 108 is arranged below free structure 104. A geometry of tunnel barrier 108 may be optimized for read endurance without being subject to the write process. In some examples, a write process occurs via SHE structure 102 and free structure 104 without using tunnel barrier 108.

Switching element 114 may be configured to operate in a first state (e.g., switched-in) that generates an electrical channel coupling bottom electrode 112 to processing circuitry 116 and in a second state (e.g., switched-out) that refrains from generating the electrical channel coupling bottom electrode 112 to processing circuitry 116. Examples of switching element 114 may include, but are not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same.

Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. Examples of BJTs may include, but are not limited to, PNP, NPN, heterojunction, or any other type of BJT, or any combination of the same. It should be understood that switching elements may be high-side or low-side switching elements. Additionally, switching elements may be voltage-controlled and/or current-controlled. Examples of current-controlled switching elements may include, but are not limited to, gallium nitride (GaN) MOSFETs, BJTs, or other current-controlled elements.

Processing circuitry 116 include metallization and/or integrated circuitry (e.g., Complementary metal-oxide-semiconductor (CMOS)). Processing circuitry 116 may include an analog circuit. In some examples, processing circuitry 116 may include a microcontroller on a single integrated circuit containing a processor core, memory, inputs, and outputs. For example, processing circuitry 116 may include one or more processors, including one or more microprocessors, Digital Signal Processors (DSPs), ASICS, Field Programmable Gate Arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, processing circuitry 116 include a combination of one or more analog components and one or more digital components.

In the example of FIG. 1, processing circuitry 116 may use a magnetization direction (e.g., parallel orientation or anti-parallel orientation) of free structure 104 relative to pinned structure 110 to write a state (e.g., logical '1' or logical '0') of MTJ element 124. Given charge current between S1 and S2 of SHE structure 102, the spin Hall effect produces spin ordering that results in spin diffusion and then spin accumulation. The spin accumulation is a consequence of the spin current in the SHE structure 102 and leads to an accumulation of electrons at a surface of the SHE structure 102 with a common spin state (e.g., spin-up or spin-down). The spin accumulation is transferred into free structure 104, which induces magnetic precession and/or switching of a magnetization direction of free structure 104. In this way, processing circuitry 116 may be configured to generate a current between S1 and S2 of SHE structure 102 to set a state of free structure 104 (e.g., parallel orientation or anti-parallel orientation), and therefore MTJ element 124.

For example, processing circuitry 116 may receive an instruction to set MTJ element 124 to a target state of a plurality of states. For instance, processing circuitry may receive an instruction to set MTJ element 124 to a logical state '1' of logical states '0' and '1'. In some instances, processing circuitry may receive an instruction to set MTJ element 124 to a logical '0' state of logical states '0' and '1'. Logical state '1' may refer instances where MTJ element 124 is set in parallel orientation and logical state '0' may refer instances where MTJ element 124 is set in anti-parallel orientation. In some examples, however, logical state '1' may refer instances where MTJ element 124 is set in anti-parallel orientation and logical state '0' may refer instances where MTJ element 124 is set in parallel orientation.

A parallel state of MTJ element 124 may include instances when free structure 104 has a magnetization direction that is in parallel with pinned structure 110. In the example of FIG. 1, MTJ element 124 may be set in the parallel state when free structure 104 has a horizontal magnetization direction and pinned structure 110 has a horizontal magnetization direction. In some examples, MTJ element 124 may be set in the parallel state when free structure 104 has a vertical magnetization direction and pinned structure 110 has a vertical magnetization direction. Similarly, an anti-parallel state of MTJ element 124 may include instances when free structure 104 has a magnetization direction that is in anti-parallel with pinned structure 110. In the example of FIG. 1, MTJ element 124 may be set in the anti-parallel state when free structure 104 has a horizontal magnetization direction and pinned structure 110 has a vertical magnetization direction. In some examples, MTJ element 124 may be set in the anti-parallel state when free structure 104 has a vertical magnetization direction and pinned structure 110 has a horizontal magnetization direction.

In response to receiving the instruction, processing circuitry 116 may generate electrical current through SHE structure 102 to modify a resistance of MTJ element 124 to correspond to the target state. For example, processing circuitry 116 may generate a charge current, Ic, in SHE structure 102 (e.g., flowing from S1 to S2 or flowing from S2 to S1) that induces spin accumulation (e.g., spin-up or spin-down), and spin transfer into free structure 104 via spin-orbit torque and spin coupling that sets a magnetization direction of free structure 104 according to the spin accumulation of SHE structure 102.

For example, processing circuitry 116 may generate a charge current, Ic, in SHE structure 102 flowing from S1 to S2 that induces a spin-up spin accumulation, and spin transfer into free structure 104 via spin-orbit torque and spin coupling that sets a magnetization direction of free structure 104 to a first state. In this instance, processing circuitry 116 may generate a charge current, Ic, in SHE structure 102 flowing from S2 to S1 that induces a spin-down spin accumulation, and spin transfer into free structure 104 via spin-orbit torque and spin coupling that sets a magnetization direction of free structure 104 to a second state.

Processing circuitry 116 may generate the charge current, Ic, in SHE structure 102 to induce spin accumulation that is subject to characteristic lengths and times, of nanometers (nm) to micrometers (um) and picoseconds (ps) to nanoseconds (ns), respectively. Processing circuitry 116 may perform a readback using TMR (Tunneling Magneto-Resistance), GMR (Giant Magneto-Resistance), and/or AMR (Anisotropic Magneto-Resistance) effects. In this manner, SHE structure 102 and MTJ element 124 may be used to perform a write operation using a spintronic Hall effect.

Processing circuitry 116 may perform a read operation on MTJ element 124 using a magneto-resistance of MTJ element 124 and output a result of the read operation. For example, processing circuitry 116 may determine a state of MTJ element 124 is in a parallel magnetization state in response to determining magneto-resistance at MTJ element 124 is less than a threshold resistance. In some examples, processing circuitry 116 may determine the state of MTJ element 124 is in an anti-parallel magnetization state in response to determining the magneto-resistance at MTJ element 124 is not less than a threshold resistance.

In some examples, processing circuitry may perform a read operation using switching element 114. As shown, switching element 114 may be electrically coupled to pinned structure 110 via bottom electrode 112. In the example of FIG. 1, SHE structure 102, MTJ element 124, and switching element 114 may form a series string. In this example, processing circuitry 116 may apply a read voltage across the series string and detect a sense voltage across switching element 114 while applying the read voltage across the series string. For example, processing circuitry 116 may determine the magneto-resistance at MTJ element 124 is less than a threshold resistance in response to the sense voltage being greater than a voltage threshold and determine the magneto-resistance at MTJ element 124 is not less than the threshold resistance in response to the sense voltage being not being greater than the voltage threshold. For example, to detect a magneto-resistance of MTJ element 124, processing circuitry 116 may apply a read voltage to S1 and/or S2 and detect a voltage at bottom electrode 112. For instance, processing circuitry 116 may read a higher voltage when MTJ element 124 is programmed in a first state (e.g., MTJ element 124 has a parallel magnetization direction state) compared to when MTJ element 124 is programmed in a second state (e.g., MTJ element 124 has an anti-parallel magnetization direction state).

While the example of FIG. 1 includes one MTJ element 124, in other examples, a SHE device may include more than one (e.g., 2, 3, 4, etc.) MTJ elements. Additionally, while MTJ element 124 is illustrated as being arranged below SHE structure 102, in other examples, MTJ element 124 may be arranged differently with SHE structure 102. For example, MTJ element 124 may be arranged on a top and/or side portion of SHE structure 102. Although the example of FIG. 1 illustrates a top portion of free structure 104 being directly adjacent to SHE structure 102, in other examples, a bottom and/or a side portion of free structure 104 may be directly adjacent to SHE structure 102.

SHE device 100 may have a high data retention because a shape (e.g., anisotropy and energy barrier) can be independently optimized. SHE device 100 may have relatively fast write times and low write power based on rapid spin diffusion and coupling in small (sub-micron) geometries. SHE device 100 may represent a device with high scalability because write currents and read signals scale favorably with device size. For example, SHE device 100 may support write and read-out (e.g., using spin diffusion and spin transfer for writing) with a larger signal-to-noise ratio compared to memory devices relying on capacitive elements, particularly as a size of a device decreases. For example, as a size of a SHE device decreases, a resistance of the SHE device increases, and the change in resistance also increases, which results in a corresponding increase in amplitude of a voltage signal for the SHE device. As such, SHE device 100 may generate a signal that can be made large for excitation, sensing, and signal processing, and scales favorably with technology and device scaling. For SHE devices, a device resistance, magneto-resistance, applied voltage, sense currents, magnetic source field, geometry, gradient, components, magnitude, and distance may be selectable parameters.

SHE device 100 may have a high endurance due, in part, from tunnel barrier 108 being subject to a voltage only during a read operation (e.g., not during a write operation). For example, a geometry of tunnel barrier 108 may be optimized for read endurance without being subject to a write process. For instance, processing circuitry may perform a write process via SHE structure 102 and free structure 104 without using tunnel barrier 108.

Figure 2:
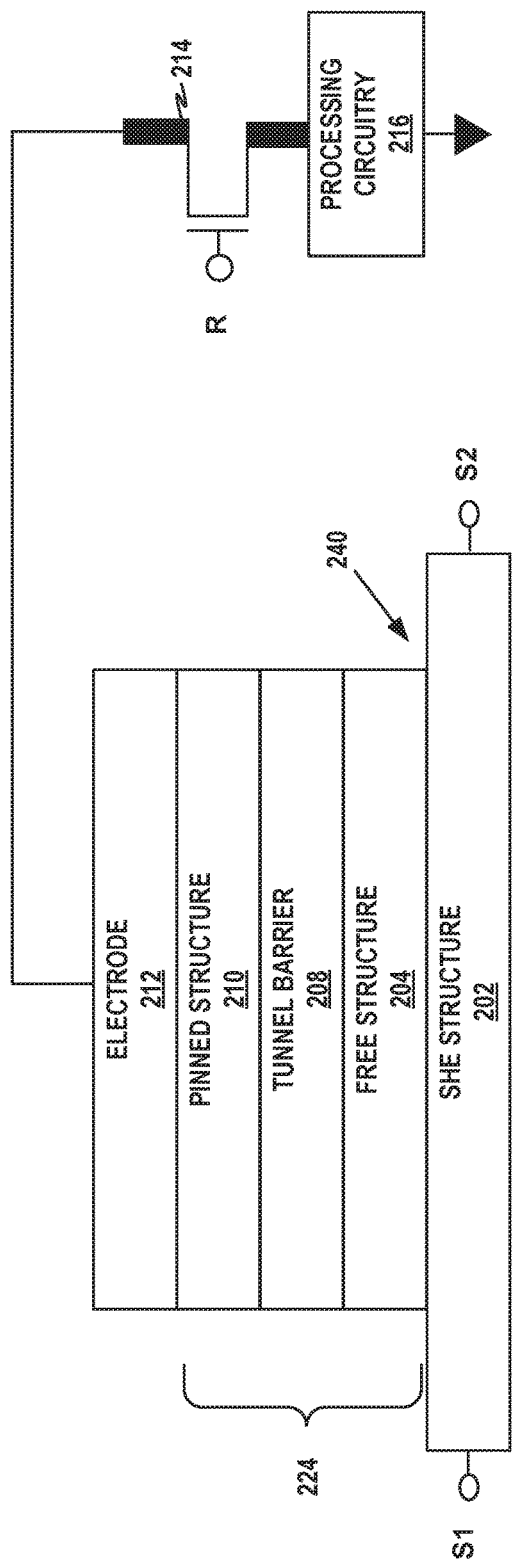
FIG. 2 shows a conceptual illustration of a second SHE device configured to perform a write operation using a spin Hall effect.

FIG. 2 shows a conceptual illustration of a second SHE device 200 configured to perform a write operation using a spin Hall effect. SHE device 200 includes SHE structure 202, free structure 204, tunnel barrier 208, pinned structure 210, electrode 212, switching element 214, and processing circuitry 216, which may be examples of SHE structure 102, free structure 104, tunnel barrier 108, pinned structure 110, bottom electrode 112, switching element 114, and processing circuitry 116 of FIG. 1, respectively.

In accordance with techniques described herein, a free structure of an MTJ device may be placed on one or more sides, for redundancy, flip-flop, or logic (A and A). In the example of FIG. 2, free structure 204 is arranged with a top surface 240 of SHE structure 202. SHE structure 202 may be forked, split, or recombined. A shape and/or material of SHE device 200 may be varied to address and/or optimize for performance, reliability, and the environment.

In the example of FIG. 2, processing circuitry 216 may use a magnetization direction of free structure 204 to store a state for MTJ element 224 using a spintronic Hall effect. For example, processing circuitry 216 may generate a charge current, Ic, in SHE structure 202 (e.g., flowing from S1 to S2 or flowing from S2 to S1) that induces spin-dependent lateral spin diffusion and spin accumulation, and spin transfer into free structure 204 via spin-orbit torque and spin coupling. Processing circuitry 216 may generate the charge current, Ic, in SHE structure 202 to induce spin accumulation that is subject to characteristic lengths and times, of nanometers (nm) to micrometers (um) and picoseconds (ps) to nanoseconds (ns), respectively. Processing circuitry 216 may perform a readback using TMR, GMR, and/or AMR effects. In this manner, SHE structure 102 and MTJ element 224 may be used to perform a write operation using a spintronic Hall effect.

Figure 3:
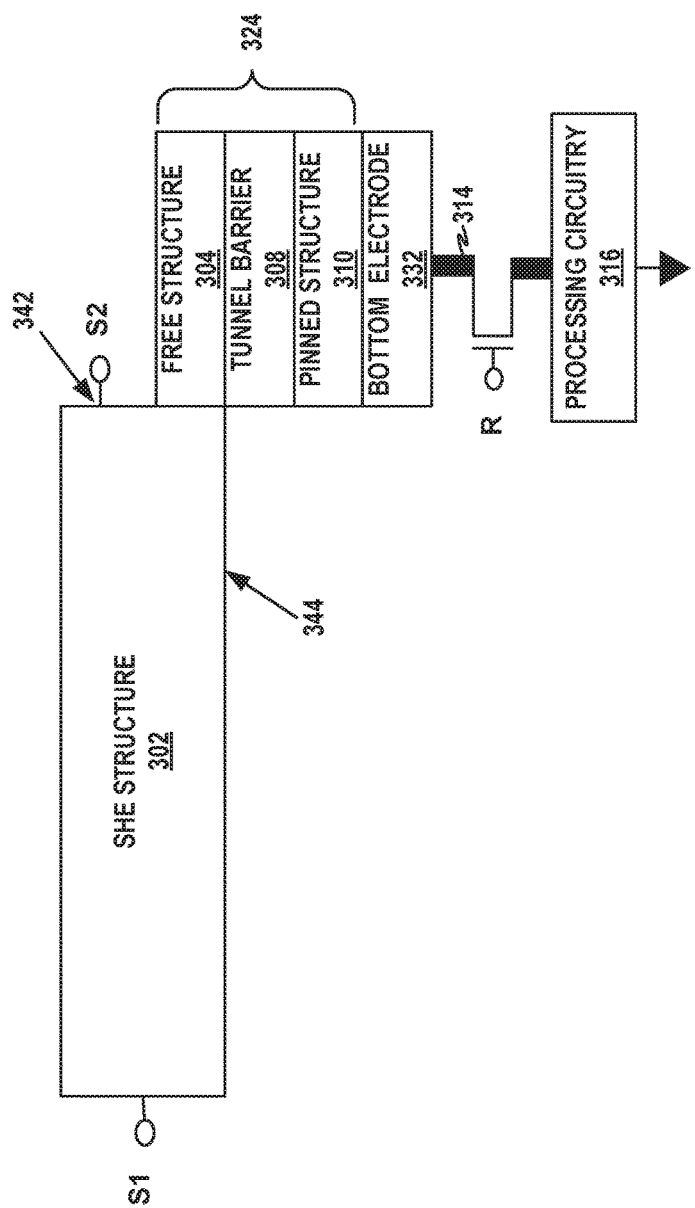
FIG. 3 shows a conceptual illustration of a third SHE device configured to perform a write operation using a spin Hall effect.

FIG. 3 shows a conceptual illustration of a third SHE device 300 configured to perform a write operation using a spin Hall effect. SHE device 300 includes SHE structure 302, free structure 304, tunnel barrier 308, pinned structure 310, electrode 312, switching element 314, and processing circuitry 316, which may be examples of SHE structure 102, free structure 104, tunnel barrier 108, pinned structure 110, bottom electrode 112, switching element 114, and processing circuitry 116 of FIG. 1, respectively. In the example of FIG. 3, free structure 304 is arranged with a side surface 342 of SHE structure 302 and tunnel barrier 308 is arranged below bottom surface 344 of SHE structure 302. Although the example of FIG. 3 illustrates MTJ element 324 on a right side of SHE structure 302, in some examples, MTJ element 324 may be arranged on a left side of SHE structure 302.

In accordance with techniques described herein, a free structure of an MTJ device may be placed on one or more sides, for redundancy, flip-flop, or logic (A and A). In the example of FIG. 3, free structure 304 is arranged with a side surface 342 of SHE structure 302 and free structure 304 is arranged with a bottom surface 344 of SHE structure 302. SHE structure 302 may be forked, split, or recombined. A shape and/or material of SHE device 300 may be varied to address and/or optimize for performance, reliability, and the environment.

In the example of FIG. 3, processing circuitry 316 may use a magnetization direction of free structure 304 to store a state for MTJ element 324 using a spintronic Hall effect. For example, processing circuitry 316 may generate a charge current, Ic, in SHE structure 302 (e.g., flowing from S1 to S2 or flowing from S2 to S1) that induces spin-dependent lateral spin diffusion and spin accumulation, and spin transfer into free structure 304 via spin-orbit torque and spin coupling. Processing circuitry 316 may generate the charge current, Ic, in SHE structure 302 to induce spin accumulation that is subject to characteristic lengths and times, of nanometers (nm) to micrometers (um) and picoseconds (ps) to nanoseconds (ns), respectively. Processing circuitry 316 may perform a readback using TMR, GMR, and/or AMR effects. In this manner, SHE structure 102 and MTJ element 324 may be used to perform a write operation using a spintronic Hall effect.

Figure 4:
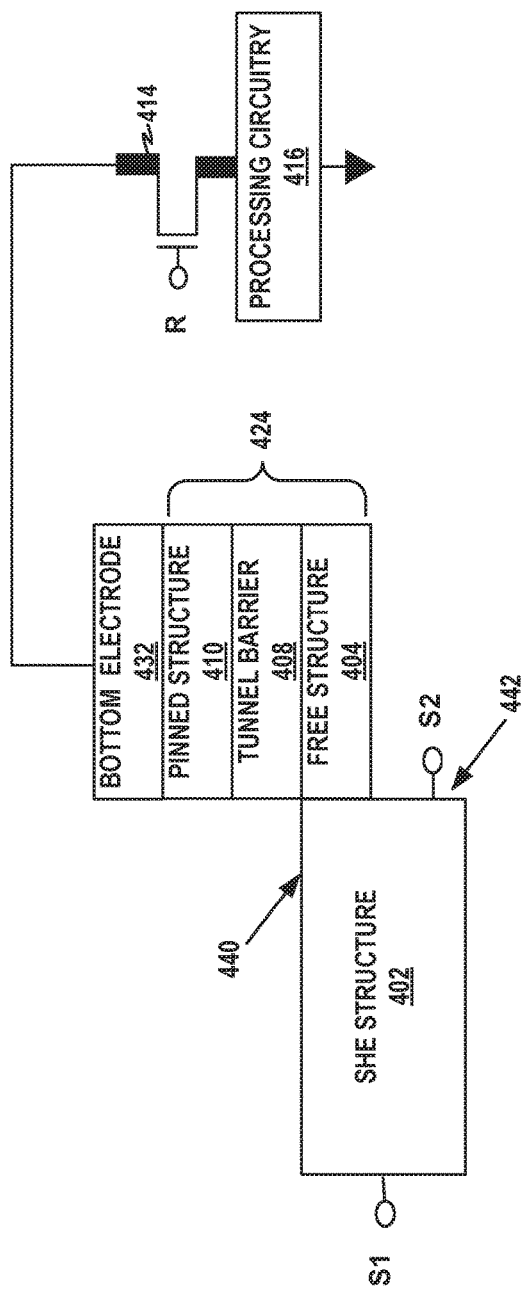
FIG. 4 shows a conceptual illustration of a fourth SHE device configured to perform a write operation using a spin Hall effect.

FIG. 4 shows a conceptual illustration of a fourth SHE device 400 configured to perform a write operation using a spin Hall effect. SHE device 400 includes SHE structure 402, free structure 404, tunnel barrier 408, pinned structure 410, electrode 412, switching element 414, and processing circuitry 416, which may be examples of SHE structure 102, free structure 104, tunnel barrier 108, pinned structure 110, bottom electrode 112, switching element 114, and processing circuitry 116 of FIG. 1, respectively. In the example of FIG. 4, free structure 404 is arranged with a side surface 442 of SHE structure 402 and tunnel barrier 408 is arranged above free structure 404. Although the example of FIG. 4 illustrates MTJ element 424 on a right side of SHE structure 402, in some examples, MTJ element 424 may be arranged on a left side of SHE structure 402.

In accordance with techniques described herein, a free structure of an MTJ device may be placed on one or more sides, for redundancy, flip-flop, or logic (A and A). In the example of FIG. 4, free structure 404 is arranged with a side surface 442 of SHE structure 402 and tunnel barrier 408 is arranged above top surface 440 of SHE structure 402. SHE structure 402 may be forked, split, or recombined. A shape and/or material of SHE device 400 may be varied to address and/or optimize for performance, reliability, and the environment.

In the example of FIG. 4, processing circuitry 416 may use a magnetization direction of free structure 404 to store a state for MTJ element 424 using a spintronic Hall effect. For example, processing circuitry 416 may generate a charge current, Ic, in SHE structure 402 (e.g., flowing from S1 to S2 or flowing from S2 to S1) that induces spin-dependent lateral spin diffusion and spin accumulation, and spin transfer into free structure 404 via spin-orbit torque and spin coupling. Processing circuitry 416 may generate the charge current, Ic, in SHE structure 402 to induce spin accumulation that is subject to characteristic lengths and times, of nanometers (nm) to micrometers (um) and picoseconds (ps) to nanoseconds (ns), respectively. Processing circuitry 416 may perform a readback using TMR, GMR, and/or AMR effects. In this manner, SHE structure 102 and MTJ element 424 may be used to perform a write operation using a spintronic Hall effect.

Figure 5:
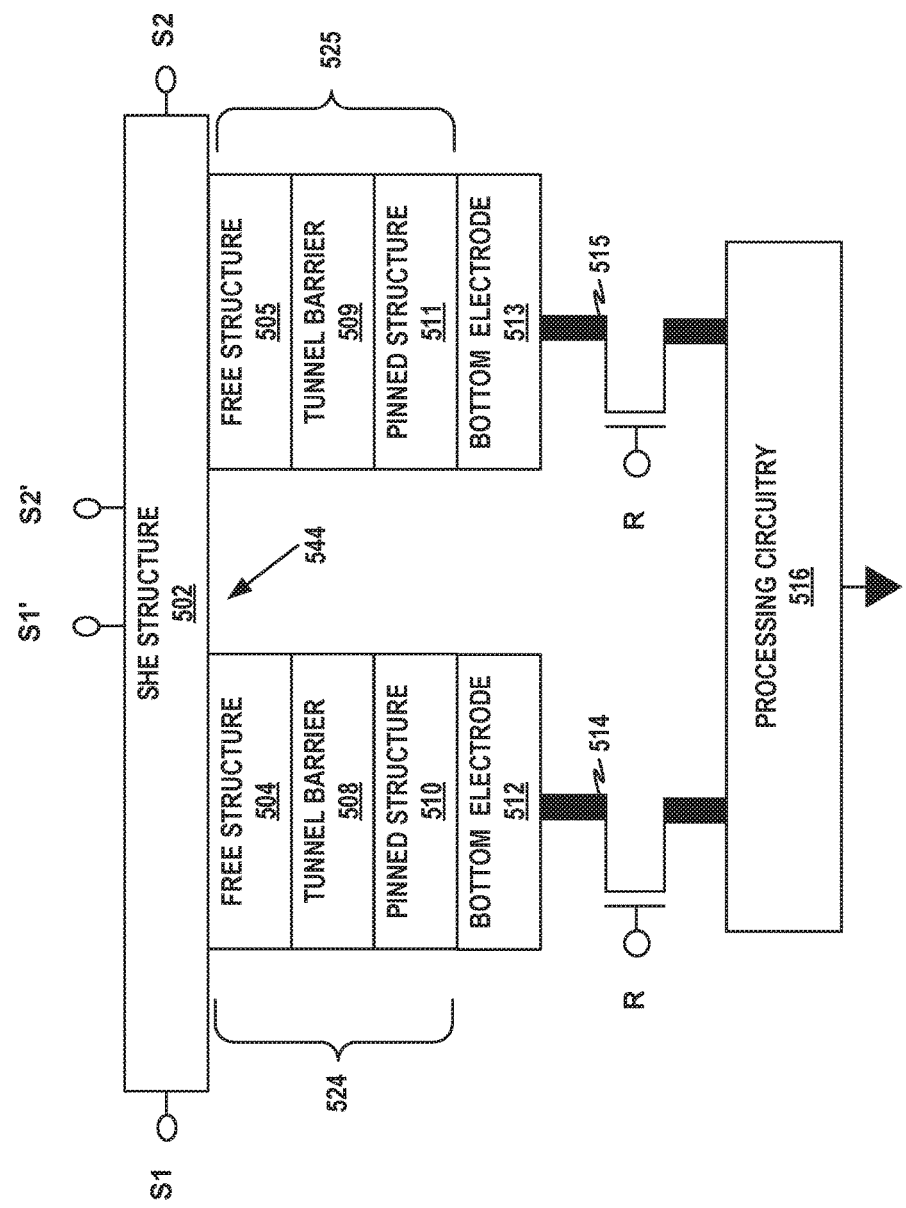
FIG. 5 shows a conceptual illustration of a fifth SHE device configured to perform a write operation using a spin Hall effect.

FIG. 5 shows a conceptual illustration of a fifth SHE device 500 configured to perform a write operation using a spin Hall effect. SHE device 500 includes SHE structure 502, free structure 504, tunnel barrier 508, pinned structure 510, electrode 512, switching element 514, and processing circuitry 516, which may be examples of SHE structure 102, free structure 104, tunnel barrier 108, pinned structure 110, bottom electrode 112, switching element 114, and processing circuitry 116 of FIG. 1, respectively. In the example of FIG. 5, free structure 504 is arranged with a bottom surface 546 of SHE structure 502. As shown, in this example, tunnel barrier 508 is arranged below free structure 504.

In accordance with techniques described herein, a free structure of an MTJ device may be placed on one or more sides, for redundancy, flip-flop, or logic (A and A). In the example of FIG. 5, MTJ element 524 is arranged on bottom surface 544 and MTJ element 525 is arranged on bottom surface 544. For example, free structure 504 is arranged with a bottom surface 544 of SHE structure 502 and free structure 505 is arranged with a bottom surface 544 of SHE structure 502. SHE structure 502 may be forked, split, or recombined. A shape and/or material of SHE device 500 may be varied to address and/or optimize for performance, reliability, and the environment.

Additionally, SHE device 500 includes MTJ element 525, bottom electrode 513 and switching element 515, which may be examples of MTJ element 124, bottom electrode 112, and switching element 114 of FIG. 1, respectively. For example, MTJ element 525 includes free structure 505, tunnel barrier 509, pinned structure 511, which may be examples of free structure 104, tunnel barrier 108, pinned structure 110 of FIG. 1, respectively. In the example of FIG. 5, free structure 505 is arranged with a bottom surface 544 of SHE structure 502. As shown, in this example, tunnel barrier 509 is arranged below free structure 505.

In the example of FIG. 5, processing circuitry 516 may use a magnetization direction of free structure 504 to store a state for MTJ element 524 and a magnetization direction of free structure 505 to store a state for MTJ element 525. For example, processing circuitry 516 may generate a first charge current, Ic, in between S1 and S1' of SHE structure 502 (e.g., flowing from S1 to S1' or flowing from S1' to S1) that induces spin-dependent lateral spin diffusion and spin accumulation, and spin transfer into free structure 504 via spin-orbit torque and spin coupling. In this examples, processing circuitry 516 may generate a second charge current, Ic, in between S2 and S2' of SHE structure 502 (e.g., flowing from S2 to S2' or flowing from S2' to S2) that induces spin-dependent lateral spin diffusion and spin accumulation, and spin transfer into free structure 505 via spin-orbit torque and spin coupling. Processing circuitry 516 may perform a readback of MTJ element 524 and/or MTJ element 525 using TMR, GMR, and/or AMR effects. In this manner, processing circuitry 516, with SHE structure 502, may perform a write operation to set a state of MTJ element 524 and MTJ element 525 using a spintronic Hall effect. SHE device 500 may increase density with common SHE structures, if metallization contact geometry allows and/or support multi-level bit stacking on die.

Figure 6:
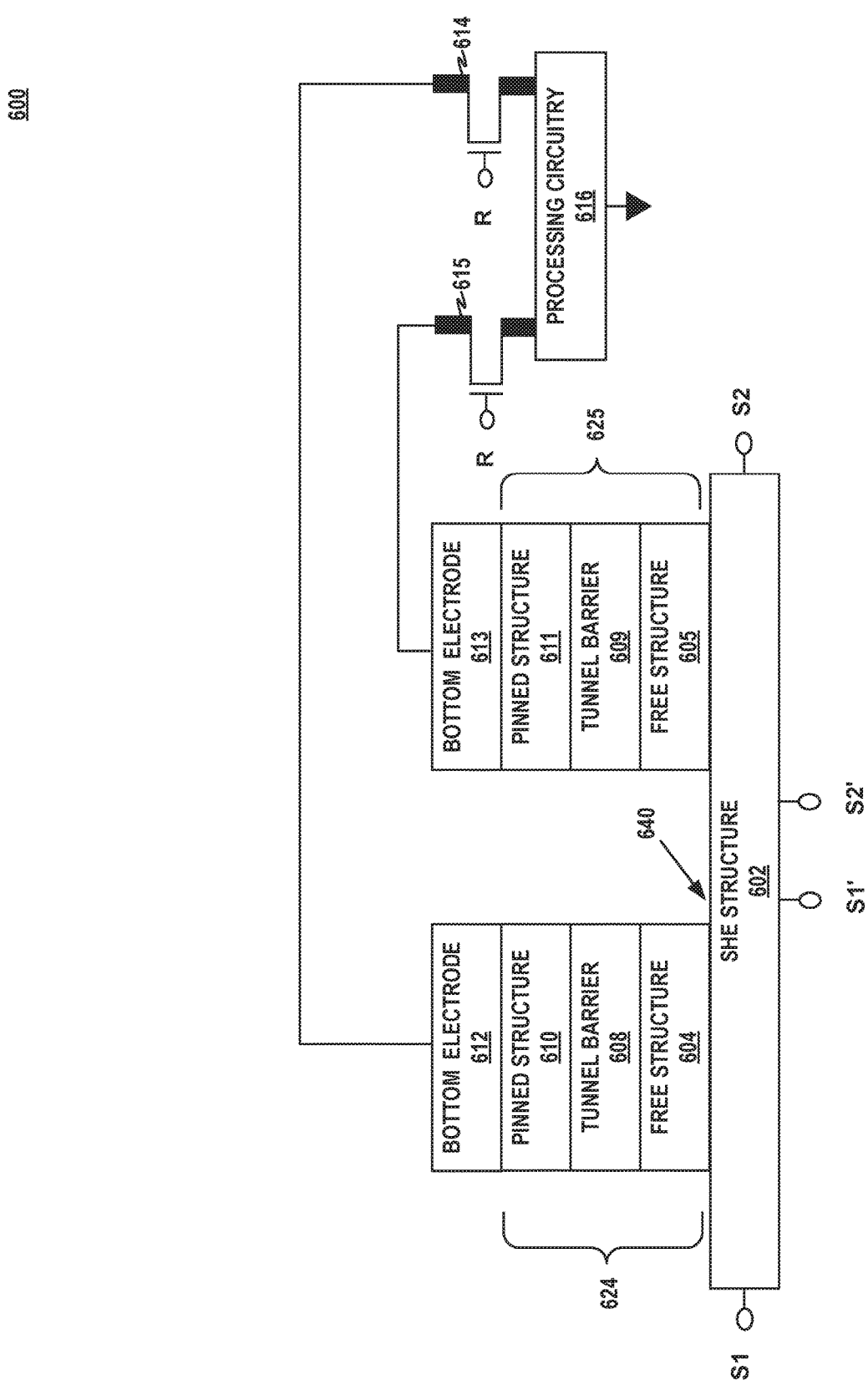
FIG. 6 shows a conceptual illustration of a sixth SHE device configured to perform a write operation using a spin Hall effect.

FIG. 6 shows a conceptual illustration of a sixth SHE device 600 configured to perform a write operation using a spin Hall effect. SHE device 600 includes SHE structure 602, free structure 604, tunnel barrier 608, pinned structure 610, electrode 612, switching element 614, and processing circuitry 616, which may be examples of SHE structure 102, free structure 104, tunnel barrier 108, pinned structure 110, bottom electrode 112, switching element 114, and processing circuitry 116 of FIG. 1, respectively. In the example of FIG. 6, MTJ element 624 is arranged on top surface 640 and MTJ element 625 is arranged on top surface 640. For example, free structure 604 is arranged with a top surface 640 of SHE structure 602. As shown, in this example, tunnel barrier 608 is arranged above free structure 604.

In accordance with techniques described herein, a free structure of an MTJ device may be placed on one or more sides, for redundancy, flip-flop, or logic (A and A). In the example of FIG. 6, free structure 604 is arranged with a top surface 640 of SHE structure 602 and free structure 605 is arranged with a top surface 640 of SHE structure 602. SHE structure 602 may be forked, split, or recombined. A shape and/or material of SHE device 600 may be varied to address and/or optimize for performance, reliability, and the environment.

Additionally, SHE device 600 includes MTJ element 625, bottom electrode 613 and switching element 615, which may be examples of MTJ element 124, bottom electrode 112, and switching element 114 of FIG. 1, respectively. For example, MTJ element 625 includes free structure 605, tunnel barrier 609, pinned structure 611, which may be examples of free structure 104, tunnel barrier 108, pinned structure 110 of FIG. 1, respectively. In the example of FIG. 6, free structure 605 is arranged with a top surface 640 of SHE structure 602. As shown, in this example, tunnel barrier 609 is arranged above free structure 605.

In the example of FIG. 6, processing circuitry 616 may use a magnetization direction of free structure 604 to store a state for MTJ element 624 and a magnetization direction of free structure 605 to store a state for MTJ element 625. For example, processing circuitry 616 may generate a first charge current, Ic, in between S1 and S1' of SHE structure 602 (e.g., flowing from S1 to S1' or flowing from S1' to S1) that induces spin-dependent lateral spin diffusion and spin accumulation, and spin transfer into free structure 604 via spin-orbit torque and spin coupling. In this examples, processing circuitry 616 may generate a second charge current, Ic, in between S2 and S2' of SHE structure 602 (e.g., flowing from S2 to S2' or flowing from S2' to S2) that induces spin-dependent lateral spin diffusion and spin accumulation, and spin transfer into free structure 605 via spin-orbit torque and spin coupling. Processing circuitry 616 may perform a readback of MTJ element 624 and/or MTJ element 625 using TMR, GMR, and/or AMR effects. In this manner, processing circuitry 616, with SHE structure 602, may perform a write operation to set a state of MTJ element 624 and MTJ element 625 using a spintronic Hall effect. SHE device 600 may increase density with common SHE structures, if metallization contact geometry allows and/or support multi-level bit stacking on die.

Figure 7:
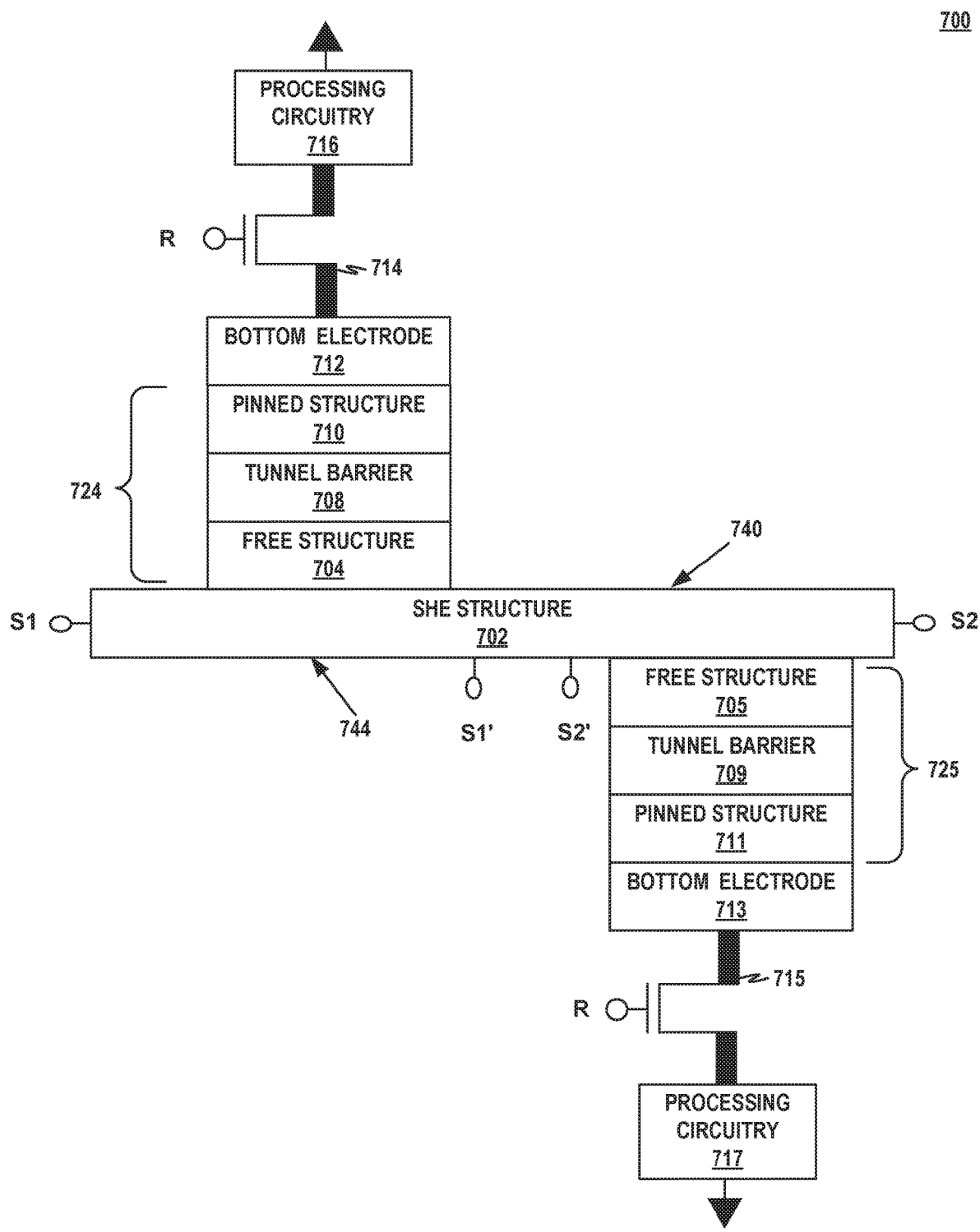
FIG. 7 shows a conceptual illustration of a seventh SHE device configured to perform a write operation using a spin Hall effect.

FIG. 7 shows a conceptual illustration of a seventh SHE device 700 configured to perform a write operation using a spin Hall effect. SHE device 700 includes SHE structure 702, free structure 704, tunnel barrier 708, pinned structure 710, electrode 712, switching element 714, and processing circuitry 716, which may be examples of SHE structure 102, free structure 104, tunnel barrier 108, pinned structure 110, bottom electrode 112, switching element 114, and processing circuitry 116 of FIG. 1, respectively. In the example of FIG. 7, MTJ element 724 is arranged on top surface 740 and MTJ element 725 is arranged on bottom surface 744. For example, free structure 704 is arranged with a top surface 740 of SHE structure 702. As shown, in this example, tunnel barrier 708 is arranged above free structure 704.

In accordance with techniques described herein, a free structure of an MTJ device may be placed on one or more sides, for redundancy, flip-flop, or logic (A and A). In the example of FIG. 7, free structure 704 is arranged with a top surface 740 of SHE structure 702 and free structure 705 is arranged with a bottom surface 744 of SHE structure 702. SHE structure 702 may be forked, split, or recombined. A shape and/or material of SHE device 700 may be varied to address and/or optimize for performance, reliability, and the environment.

Additionally, SHE device 700 includes MTJ element 725, bottom electrode 713 and switching element 715, which may be examples of MTJ element 124, bottom electrode 112, and switching element 114 of FIG. 1, respectively. For example, MTJ element 725 includes free structure 705, tunnel barrier 709, pinned structure 711, which may be examples of free structure 104, tunnel barrier 108, pinned structure 110 of FIG. 1, respectively. In the example of FIG. 7, free structure 705 is arranged with a bottom surface 744 of SHE structure 702. As shown, in this example, tunnel barrier 709 is arranged below free structure 705.

In the example of FIG. 7, processing circuitry 716 may use a magnetization direction of free structure 704 to store a state for MTJ element 724 and a magnetization direction of free structure 705 to store a state for MTJ element 725. For example, processing circuitry 716 may generate a first charge current, Ic, in between S1 and S1' of SHE structure 702 (e.g., flowing from S1 to S1' or flowing from S1' to S1) that induces spin-dependent lateral spin diffusion and spin accumulation, and spin transfer into free structure 704 via spin-orbit torque and spin coupling. In this examples, processing circuitry 716 may generate a second charge current, Ic, in between S2 and S2' of SHE structure 702 (e.g., flowing from S2 to S2' or flowing from S2' to S2) that induces spin-dependent lateral spin diffusion and spin accumulation, and spin transfer into free structure 705 via spin-orbit torque and spin coupling. Processing circuitry 716 may perform a readback of MTJ element 724 and/or MTJ element 725 using TMR, GMR, and/or AMR effects. In this manner, processing circuitry 716, with SHE structure 702, may perform a write operation to set a state of MTJ element 724 and MTJ element 725 using a spintronic Hall effect.

Figure 8:
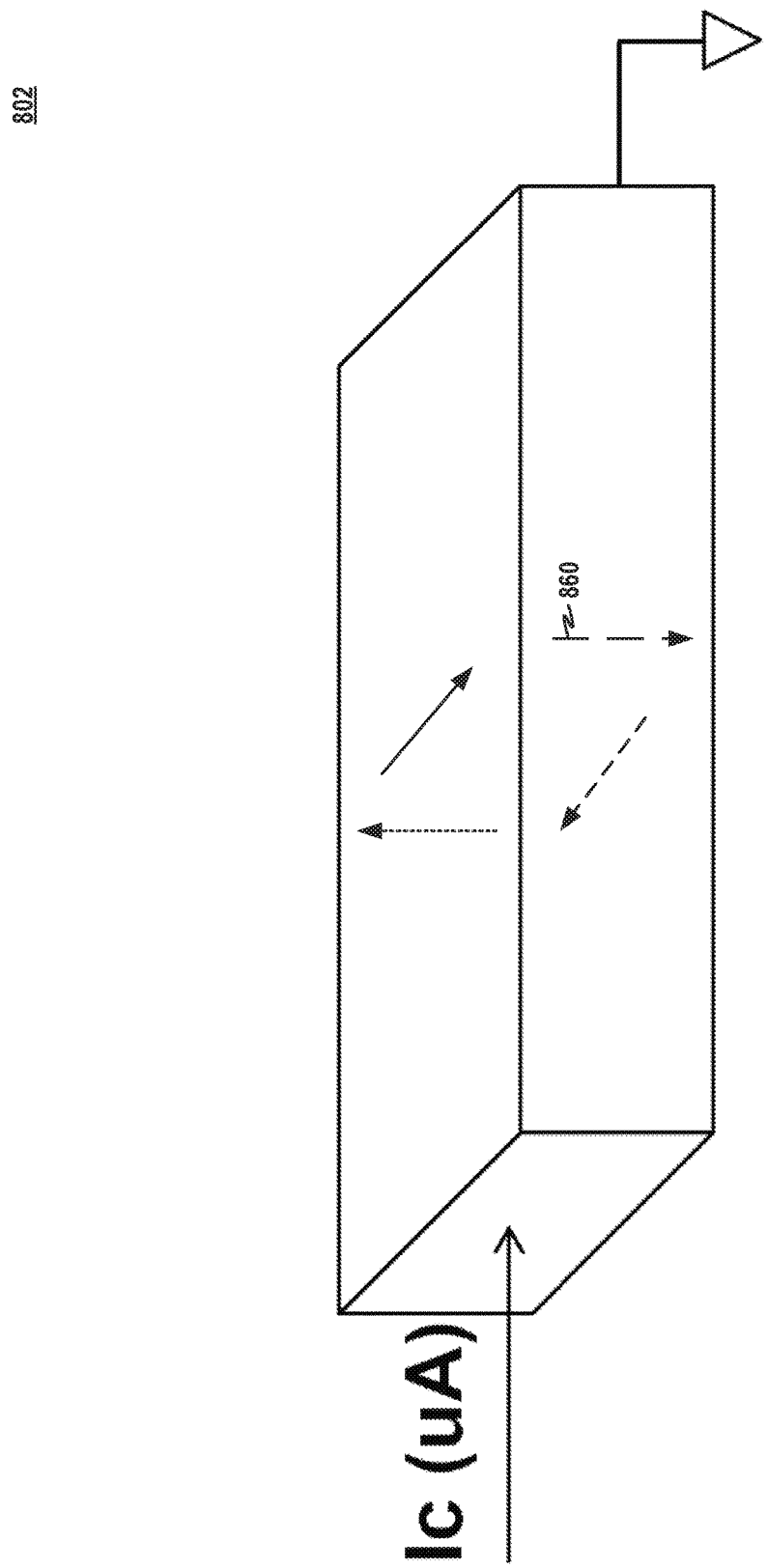
FIG. 8 shows a conceptual illustration of a SHE structure that may be used to implement the techniques of the present disclosure.

FIG. 8 shows a conceptual illustration of a SHE structure 802 that may be used to implement the techniques of the present disclosure. As shown, a current may be injected through SHE structure 802, which induces surface spin 860 accumulation in SHE structure 802. As used herein, spin Hall effect may refer to a separation of spin currents, which are extracted from a charge current, that can diffuse and accumulate at a given surface. The spin currents correspond to electrons differentiated based on the magnetic spin of the electrons. The spin Hall effect is considered to have its origins in the coupling of a charge current into spin currents caused by spin-orbit interaction. Spin Hall effect may include a spin accumulation on lateral boundaries of SHE structure 802 as indicated by surface spin 860. The direction of spin current may correspond to a direction of electrons with a given magnetic spin. For example, a reversal of current injected into SHE structure 802 may result in a corresponding reversal in electrons of a given magnetic spin. It should be understood that spin diffusion and spin accumulation may result from no magnetic field. Instead, a presence of magnetic field on SHE structure 802 may reduce or destroy spin diffusion and spin accumulation.

Figure 9:
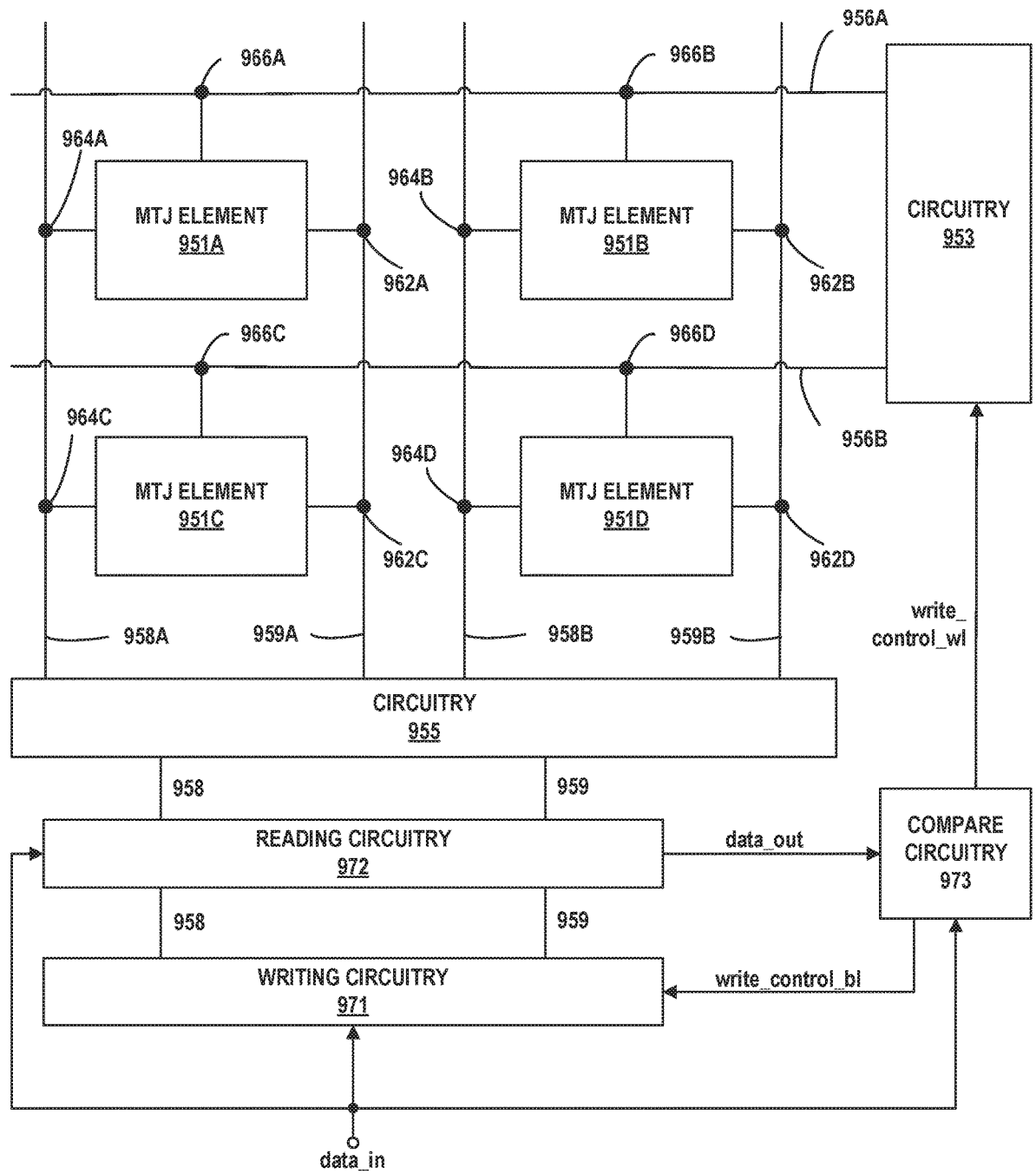
FIG. 9 shows a diagram of an array of Magnetic Tunnel Junction (MTJ) elements that may be used to implement the techniques of the present disclosure.

FIG. 9 shows a diagram of an array of MTJ elements that may be used to implement the techniques of the present disclosure. Memory devices implementing one or more of the techniques described in this disclosure may be implemented in a wide array of electronic devices ranging from small portable devices such as music players, smart phones, game cartridges, and memory sticks up to larger devices such as tablet computers, gaming devices or consoles, desktop computers, super computers, and enterprise storage solutions. Processing circuitry (e.g., processing circuitry 116, processing circuitry 216, etc.) described in FIGS. 1-8, may include circuitry 955, reading circuitry 972, writing circuitry 971, compare circuitry 973, and circuitry 953.

Bitline 958A connects to MTJ element 951A ("MTJ element") at node 964A and connects to MTJ element 951C at node 964C. Bitline 958B connects to MTJ element 951B at node 964B and connects to MTJ element 951D at node 964D. Although, not explicitly shown in FIG. 9, each of nodes 964A-964D may correspond to a source or drain terminal of an access MOSFET for current through a SHE structure of a respective MTJ element.

Bitline 959A connects to MTJ element 951A at node 962A and connects to MTJ element 951C at node 962C. Bitline 959B connects to MTJ element 951B at node 962B and connects to MTJ element 951D at node 962D. Although, not explicitly shown in FIG. 9, each of nodes 962A-962D may correspond to a source or drain terminal of an access MOSFET for current through a SHE structure of a respective MTJ element. For example, node 964A may correspond to a source or drain terminal of an access MOSFET for S1 of SHE structure 102 and node 962A may correspond to a source or drain terminal of an access MOSFET for S2 of SHE structure 102. In another example, node 964A may correspond to a source or drain terminal of an access MOSFET for S1 of SHE structure 502 and node 962A may correspond to a source or drain terminal of an access MOSFET for S1' of SHE structure 502. In this example, node 964B may correspond to a source or drain terminal of an access MOSFET for S2 of SHE structure 502 and node 962B may correspond to a source or drain terminal of an access MOSFET for S2' of SHE structure 502.

By controlling the voltages applied to wordline 956A, wordline 956B, bitline 958A, bitline 958B, bitline 959A, and bitline 959B, an individual MTJ element can be addressed. For example, suppose that a write operation is being performed on MTJ element 951A. Circuitry 953 may apply an access MOSFET turn-on voltage to wordline 956A and a turn-off voltage to wordline 956B, and circuitry 955 may pass a high voltage to bitline 959A but not to bitline 959B. In this case, the turn-on voltage applied to wordline 956A causes node 966A (connected to a gate of an access MOSFET, not shown in FIG. 9) to receive a turn-on voltage. The high voltage applied to bitline 959A causes node 962A (connected to a source or drain of an access MOSFET, not shown in FIG. 9) to receive a high voltage, and a source voltage applied to bitline 958A causes node 964A (connected to a source or drain of an access MOSFET) to receive a source voltage. As described above, the high voltage applied to node 966A causes current to flow through an access MOSFET, resulting in current through a SHE structure (e.g., between S1 and S2 of SHE structure 102, between S1 and S1' of SHE structure 502, etc.). Thus, the resistance and/or magnetoresistance of the MTJ element 951A can be changed. Examples of resistance and/or magnetoresistance may include, but are not limited to, tunnel magnetoresistance (TMR), giant magnetoresistance (GMR), anisotropic magnetoresistive (ARM), and other resistance and/or magnetoresistance.

While this write operation is occurring at MTJ element 951A, it is intended that MTJ elements 951B, 951C, and 951D remain unchanged. Although the high voltage applied to wordline 956A can cause a high voltage at node 966B (connected to a gate of an access MOSFET for MTJ element 951B), circuitry 955 may not apply a high voltage to either bitline 958B or bitline 959B. In this case, with no high voltage drop across an access MOSFET for MTJ element 951B, the state of MTJ element 951B does not change.

Similarly, while this write operation is occurring at MTJ element 951A, the high voltage applied to bitline 959A causes a high voltage at node 962C, and the source voltage applied to bitline 958A causes a source voltage at node 964C. Circuitry 953, however, applies a turn-off voltage to wordline 956B. Thus, the access MOSFET of MTJ element 951C does not conduct current, and thus it is intended that this prevents current at a SHE element for MTJ element 951C. Without a current flow, the resistance of MTJ element 951C does not change, and the state of MTJ element 951C does not change. Accordingly, by controlling the voltages applied to wordline 956A, wordline 956B, bitline 958A, bitline 958B, bitline 959A, and bitline 959B, in the manner described above, MTJ elements 951A, 951B, 951C, and 951D can be individually written to without altering the state of MTJ elements that are connected to a common wordline or common bitline.

Writing circuitry 971 receives data input (e.g., '0' or '1', which represents a state of two states. Depending on the data state to be written, writing circuitry 971 defines the appropriate voltage to be applied to the bitlines. As discussed above, circuitry 955 controls the passing of the voltages from writing circuitry 971 output bitline 958 and bitline 959 to the various bitlines so that the write operation is applied to the correct MTJ element within the array of MTJ elements.

Reading circuitry 972 is configured to monitor the resistance and/or magnetoresistance of a given MTJ element, which may correspond to a spin-dependent diffusion, spin-orbit coupling, and spin transfer of the given MTJ element, while the given MTJ element is undergoing a write operation. This monitoring of the resistance and/or magnetoresistance is termed Rmonitor, which represents the real time measuring of the MTJ element resistance and/or magnetoresistance during the write operation. Reading circuitry 972 uses the write "0" or "1" states defined on data_in to determine which monitoring state and Rwrite_ref to set up.

Compare circuitry 973 compares the "0" or "1" data state of the selected MTJ element of MTJ elements 951A-951D, as determined by reading circuitry 972 and defined on node data_out, to the "0" or "1" data state as defined on node data_in and issues a write terminate instruction on the write_control_bl and write_control_wl lines upon determining that the data states on data_in and data_out match.

When circuitry 973 issues a write terminate command on write_control_bl to writing circuitry 971, writing circuitry 971 terminates the application of the high voltage on bitline 958 or bitline 959 which causes the high voltage across the selected MTJ element to collapse and, thus, stop the resistance and/or magnetoresistance changing and stop modifying spin-dependent diffusion, spin-orbit coupling, and spin transfer of the MTJ element. When circuitry 973 issues a write terminate command on write_control_wl to circuitry 953, circuitry 953 changes the turned-on wordline to turned-off which causes the current through a SHE structure for the selected MTJ element to collapse and, thus, stop the resistance and/or magnetoresistance changing in the MTJ element.

In accordance with one or more techniques described herein, writing circuitry 971 is configured to receive an instruction to set an MTJ element to a target state of a plurality of states. For example, writing circuitry 971 may be configured to receive an instruction to set MTJ element 951A to a state '1'. In response to receiving the instruction, writing circuitry 971 may be configured to generate electrical current through the spin Hall effect structure to modify a resistance of the MTJ element to correspond to the target state. For example, writing circuitry 971 may be configured to define the appropriate voltage to be applied to the bitlines. In this example, circuitry 955 controls the passing of voltages from writing circuitry 971 output bitline 958 and bitline 959 to the various bitlines such that the write operation is applied to the correct MTJ element within the array of MTJ elements. For instance, writing circuitry 971 generates electrical current through a SHE structure for MTJ element 951 to set MTJ element 951 to a state '1'.

Figure 10:
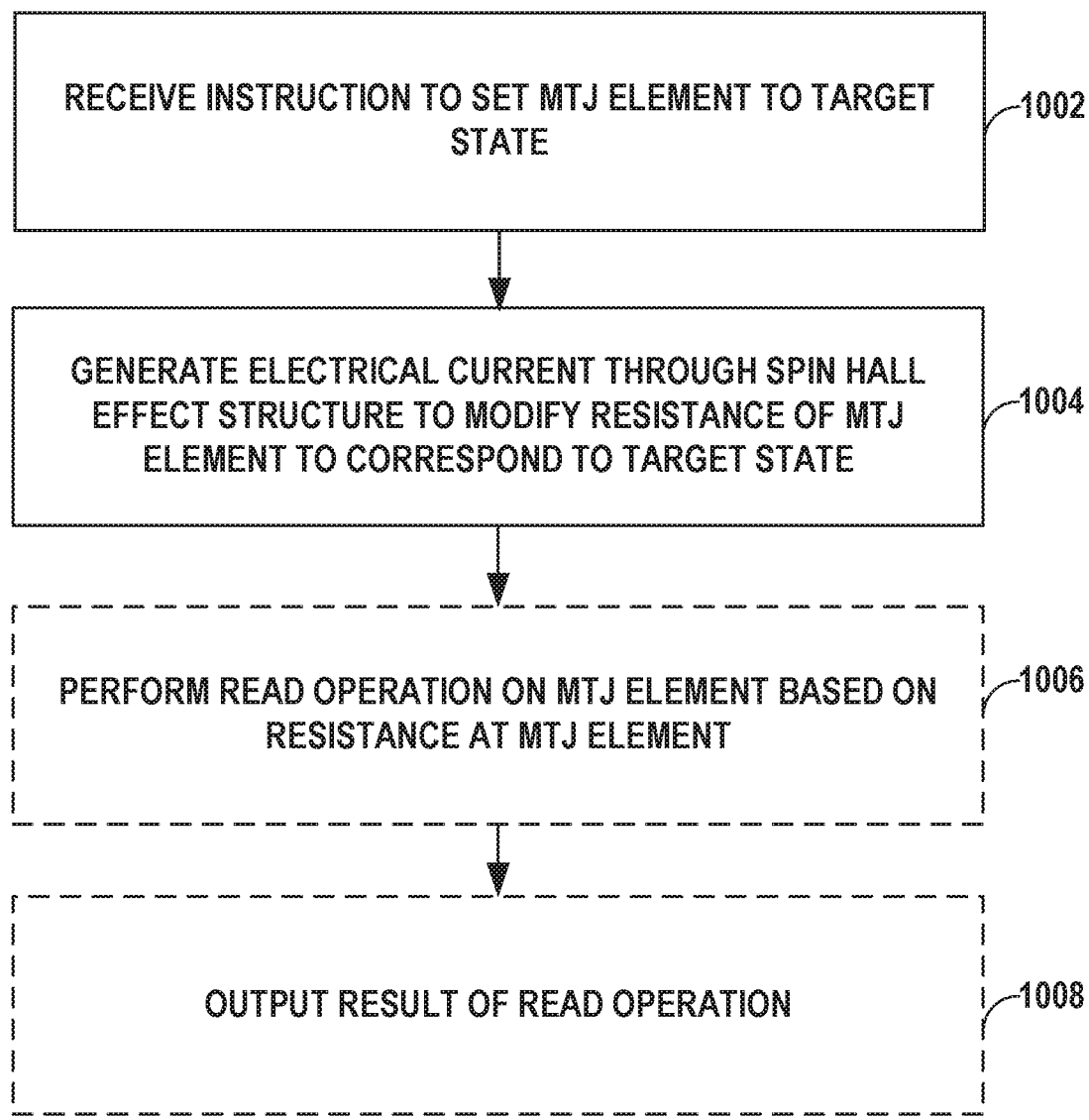
FIG. 10 shows a flowchart of a process for performing a write operation using a spin Hall effect in accordance with the techniques of this disclosure.

FIG. 10 shows a flowchart of a process for performing a write operation using a spin Hall effect in accordance with the techniques of this disclosure. The techniques of FIG. 10 may, for example, be performed by a SHE device described above with respect to any combination of FIGS. 1-9. Processing circuitry 116 receives an instruction to set MTJ element 124 to a target state of a plurality of states (1002). For example, processing circuitry 116 receives an instruction to set MTJ element 124 to a high logical value "1." Processing circuitry 116 generates electrical current through SHE structure 102 to modify a resistance of the MTJ element 124 to correspond to the target state (1004). For example, processing circuitry 116 generates electrical current through SHE structure 102 to modify a spin-dependent diffusion, spin-orbit coupling, and spin transfer of MTJ element 124 to a resistance that corresponds to the high logical value "1."

Processing circuitry 116 may optionally perform a read operation on MTJ element 124 based on a resistance at MTJ element 124 (1006). For example, processing circuitry 116 determines MTJ element 124 has a state of the high logical value "1" when a resistance of MTJ element 124 corresponds to the high logical value "1." Processing circuitry 116 may optionally output an indication of the read operation (1008). For example, processing circuitry 116 outputs a high logical value "1" in response to the read operation on MTJ element 124. While the example of FIG. 10 is discussed with respect to SHE device 100 of FIG. 1, the method of FIG. 10 may be implemented using other SHE devices, such as, but not limited to, SHE devices of FIGS. 2-9.

Figure 11:
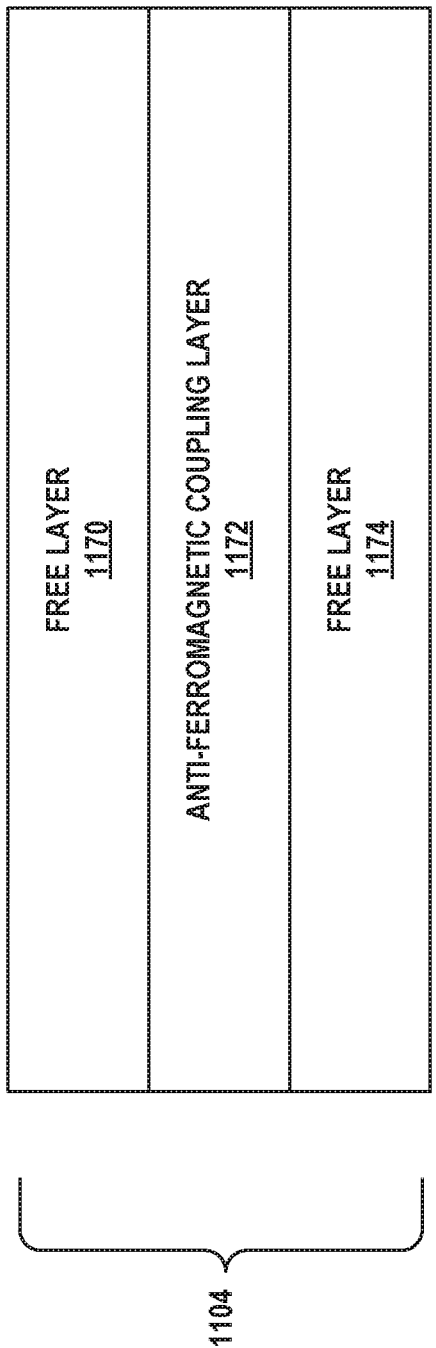
FIG. 11 shows a conceptual illustration of a first free structure that may be used to implement the techniques of the present disclosure.

FIG. 11 shows a conceptual illustration of a first free structure 1104 that may be used to implement the techniques of the present disclosure. Free structure 1104 may be an example of a free structure described above with respect to any combination of FIGS. 1-10. As shown, free structure 1104 may include free layer 1170, anti-ferromagnetic coupling layer 1172, and free layer 1174. Free layer 1170 may include a magnetization direction that is free to switch between a parallel orientation and an antiparallel orientation. Similarly, free layer 1174 may include a magnetization direction that is free to switch between a parallel orientation and an antiparallel orientation.

In the example of FIG. 11, free structure 1104 includes anti-ferromagnetic coupling layer 1172, which is arranged between free layer 1170 and free layer 1174. Anti-ferromagnetic coupling layer 1172 may be configured to stabilize a magnetic state of free layer 1170 and/or free layer 1174. Anti-ferromagnetic coupling layer 1172 may be formed of, for example, Ruthenium (Ru). Although the example of FIG. 11 illustrates a free structure with two free layers, in some examples, a free structure may include one free layer (e.g., without anti-ferromagnetic coupling layer 1182) or more than two free layers (e.g., each pair of free layers spaced apart by a respective anti-ferromagnetic coupling layer).

Forming free structure 1104 with multiple free layers (e.g., free layer 1170 and free layer 1174) may help to improve a robustness and reliability of free structure 1104, which may help to improve an operation of a resulting SHE device. For example, forming free structure 104 of FIG. 1 with multiple free layers as shown in the example of FIG. 11 may result in SHE device 100 operating with a higher resistance to stray magnetic fields and radiation, which may result in SHE device 100 storing data longer and more with higher reliability compared to systems that use only one free layer.

Figure 12:
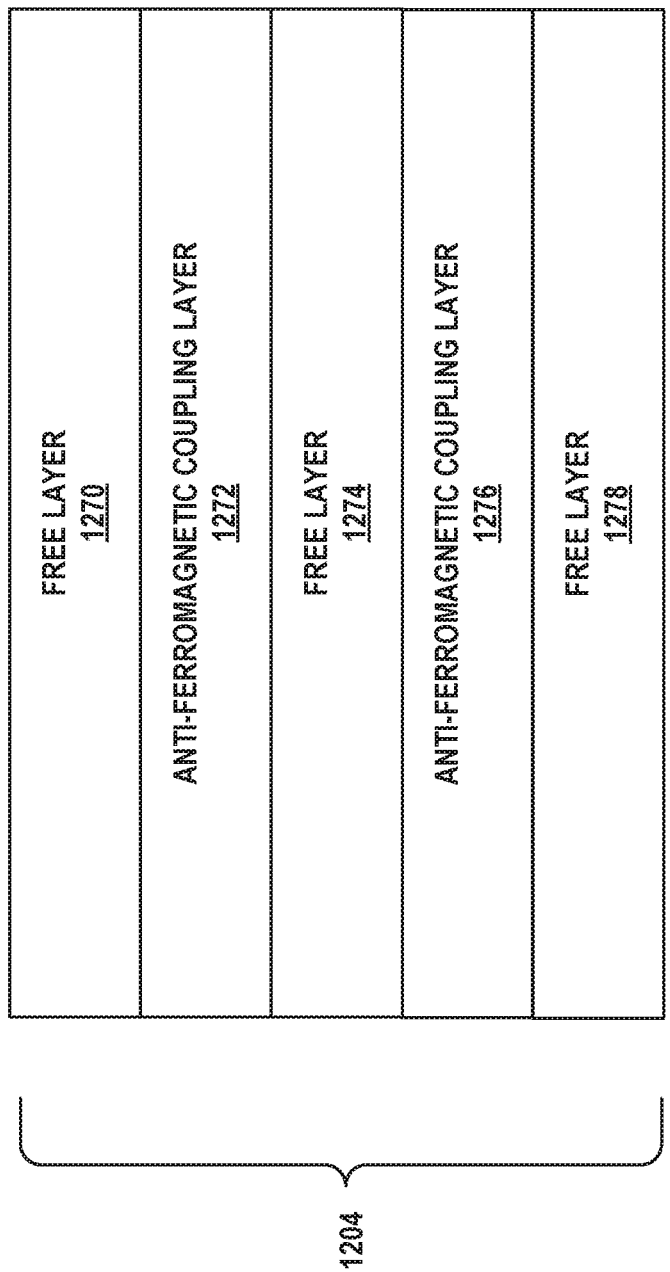
FIG. 12 shows a conceptual illustration of a second free structure that may be used to implement the techniques of the present disclosure.

FIG. 12 shows a conceptual illustration of a second free structure that may be used to implement the techniques of the present disclosure. Free structure 1204 may be an example of a free structure described above with respect to any combination of FIGS. 1-11. As shown, free structure 1204 may include free layer 1270, anti-ferromagnetic coupling layer 1272, free layer 1274, anti-ferromagnetic coupling layer 1276, and free layer 1278. Free layers 1270, 1274, and 1278 may each include a magnetization direction that is free to switch between a parallel orientation and an antiparallel orientation.

In the example of FIG. 12, free structure 1204 includes anti-ferromagnetic coupling layer 1272, which is arranged between free layer 1270 and free layer 1274. and anti-ferromagnetic coupling layer 1278, which is arranged between free layer 1274 and free layer 1278. Anti-ferromagnetic coupling layers 1272 and 1278 may be configured to stabilize a magnetic state of one or more of free layers 1270, 1274, and 1278. Anti-ferromagnetic coupling layer 1272 and/or anti-ferromagnetic coupling layer 1278 may be formed of, for example, Ruthenium (Ru). Although the example of FIG. 12 illustrates a free structure with three free layers, in some examples, a free structure may include more than three free layers.

Forming free structure 1204 with multiple free layers (e.g., free layer 1270, free layer 1274, and free layer 1278) may help to improve a robustness and reliability of free structure 1204, which may help to improve an operation of a resulting SHE device. For example, forming free structure 104 of FIG. 1 with multiple free layers as shown in the example of FIG. 12 may result in SHE device 100 operating with a higher resistance to stray magnetic fields and radiation, which may result in SHE device 100 storing data longer and more with higher reliability compared to systems that use only one free layer.

Figure 13:
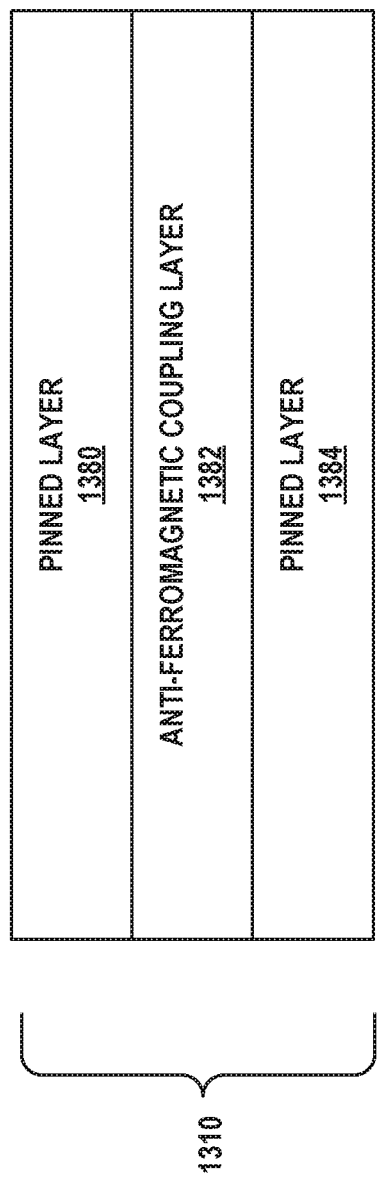
FIG. 13 shows a conceptual illustration of a first pinned structure that may be used to implement the techniques of the present disclosure.

FIG. 13 shows a conceptual illustration of a first pinned structure that may be used to implement the techniques of the present disclosure. Pinned structure 1310 may be an example of a pinned structure described above with respect to any combination of FIGS. 1-12. As shown, pinned structure 1310 may include pinned layer 1380, anti-ferromagnetic coupling layer 1382, and pinned layer 1384. Pinned layer 1380 may include a magnetization direction that is fixed or "pinned" to a single orientation. For example, pinned layer 1380 may be pinned in a parallel orientation. In other examples, pinned layer 1380 may be pinned in an antiparallel orientation. Similarly, pinned layer 1384 may include a magnetization direction that is fixed or "pinned" to a single orientation.

In the example of FIG. 13, pinned structure 1310 includes anti-ferromagnetic coupling layer 1382, which is arranged between pinned layer 1380 and pinned layer 1384. Anti-ferromagnetic coupling layer 1382 may be configured to stabilize a magnetic state of pinned layer 1380 and/or pinned layer 1384. Anti-ferromagnetic coupling layer 1382 may be formed of, for example, Ruthenium (Ru). Although the example of FIG. 13 illustrates a pinned structure with two pinned layers, in some examples, a pinned structure may include one pinned layer (e.g., without anti-ferromagnetic coupling layer 1382) or more than two pinned layers (e.g., each pair of pinned layers spaced apart by a respective anti-ferromagnetic coupling layer).

Forming pinned structure 1310 with multiple pinned layers (e.g., pinned layer 1380 and pinned layer 1384) may help to improve a robustness and reliability of pinned structure 1310, which may help to improve an operation of a resulting SHE device. For example, forming pinned structure 110 of FIG. 1 with multiple pinned layers as shown in the example of FIG. 13 may result in SHE device 100 operating with a higher resistance to stray magnetic fields and radiation, which may result in SHE device 100 storing data longer and more with higher reliability compared to systems that use only one pinned layer.

Figure 14:
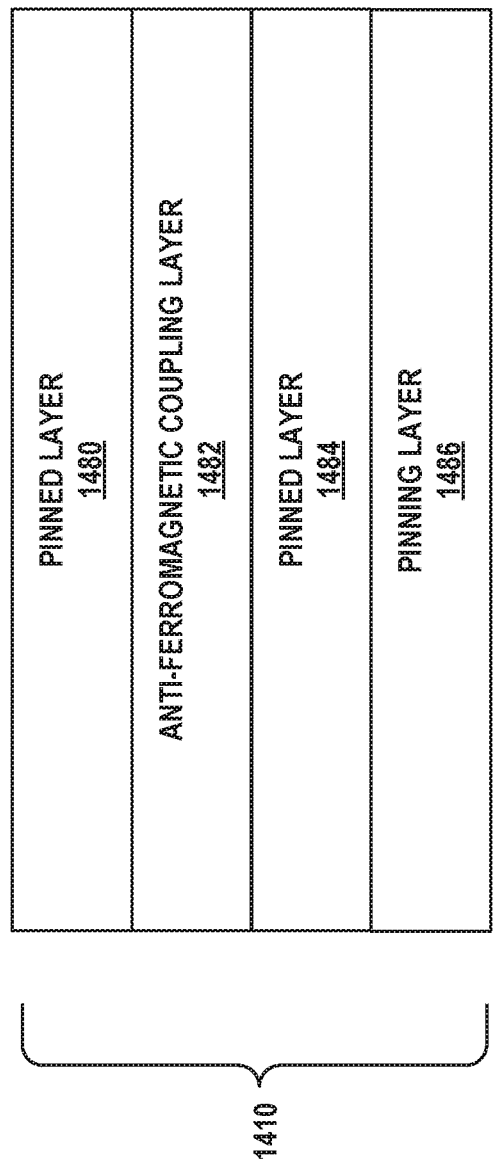
FIG. 14 shows a conceptual illustration of a second pinned structure that may be used to implement the techniques of the present disclosure.

FIG. 14 shows a conceptual illustration of a second pinned structure that may be used to implement the techniques of the present disclosure. Pinned structure 1410 may be an example of a pinned structure described above with respect to any combination of FIGS. 1-13. As shown, pinned structure 1410 may include pinned layer 1480, anti-ferromagnetic coupling layer 1482, pinned layer 1484, and pinning layer 1486. Pinned layer 1480 may include a magnetization direction that is fixed or "pinned" to a single orientation. For example, pinned layer 1480 may be pinned in a parallel orientation. In other examples, pinned layer 1480 may be pinned in an antiparallel orientation. Similarly, pinned layer 1484 may include a magnetization direction that is fixed or "pinned" to a single orientation. In some examples, pinning layer 1486 may be arranged directly adjacent to a bottom electrode and pinned layer 1480 may be arranged directly adjacent to a tunnel barrier.

In the example of FIG. 14, pinned structure 1410 includes anti-ferromagnetic coupling layer 1482, which is arranged between pinned layer 1480 and pinned layer 1484. Anti-ferromagnetic coupling layer 1482 may be configured to stabilize a magnetic state of pinned layer 1480 and/or pinned layer 1484. Anti-ferromagnetic coupling layer 1482 may be formed of, for example, Ruthenium (Ru). Although the example of FIG. 14 illustrates a pinned structure with two pinned layers, in some examples, a pinned structure may include one pinned layer or more than two pinned layers.

Pinning layer 1486 may be configured to stabilize a magnetic state of pinned layer 1480 and/or pinned layer 1484. Pinning layer 1486 may be formed of an anti-ferromagnetic material. For example, pinning layer 1486 may be formed of, for example, but not limited to, platinum manganese (PtMn), iron manganese (FeMn), iridium manganese (IrMn), or another material. In some examples, pinning layer 1486 may be arranged directly adjacent to a bottom electrode and pinned layer 1480 may be arranged directly adjacent to a tunnel barrier.

Forming pinned structure 1410 with multiple pinned layers (e.g., pinned layer 1480, pinned layer 1484, and pinned layer 1486) may help to improve a robustness and reliability of pinned structure 1410, which may help to improve an operation of a resulting SHE device. For example, forming pinned structure 110 of FIG. 1 with multiple pinned layers as shown in the example of FIG. 14 may result in SHE device 100 operating with a higher resistance to stray magnetic fields and radiation, which may result in SHE device 100 storing data longer and more with higher reliability compared to systems that use only one pinned layer.

Figure 15:
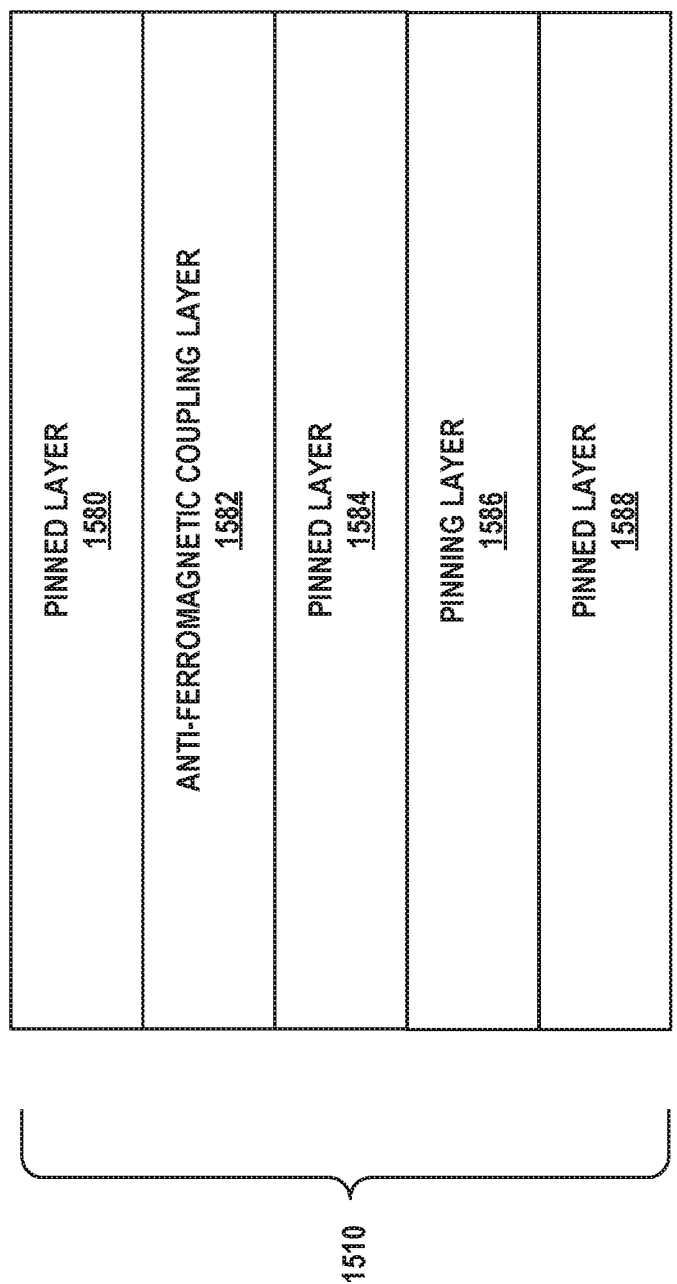
FIG. 15 shows a conceptual illustration of a third pinned structure that may be used to implement the techniques of the present disclosure.

FIG. 15 shows a conceptual illustration of a third pinned structure that may be used to implement the techniques of the present disclosure. Pinned structure 1510 may be an example of a pinned structure described above with respect to any combination of FIGS. 1-14.

As shown, pinned structure 1510 may include pinned layer 1580, anti-ferromagnetic coupling layer 1582, pinned layer 1584, pinning layer 1586, and pinned layer 1588. Pinned layers 1580, 1584, and 1588 may each include a magnetization direction that is fixed or "pinned" to a single orientation. The addition of pinned layer 1588 may help to improve a stability of one or more of pinned layers 1580, 1584, and 1588. Pinning layer 1586 may be formed of an anti-ferromagnetic material. For example, pinning layer 1586 may be formed of, for example, but not limited to, platinum manganese (PtMn), iron manganese (FeMn), iridium manganese (IrMn), or another material. In some examples, pinned layer 1588 may be arranged directly adjacent to a bottom electrode and pinned layer 1580 may be arranged directly adjacent to a tunnel barrier.

In the example of FIG. 15, pinned structure 1510 includes anti-ferromagnetic coupling layer 1582, which is arranged between pinned layer 1580 and pinned layer 1584. Anti-ferromagnetic coupling layer 1582 may be configured to stabilize a magnetic state of pinned layer 1580 and/or pinned layer 1584. Anti-ferromagnetic coupling layer 1582 may be formed of, for example, Ruthenium (Ru). Although the example of FIG. 15 illustrates a pinned structure with two pinned layers, in some examples, a pinned structure may include one pinned layer or more than two pinned layers.

The term "circuitry" as used herein may refer to any of the foregoing structure or any other structure suitable for processing program code and/or data or otherwise implementing the techniques described herein. Circuitry may, for example, include any of a variety of types of solid state circuit elements, such as CPUs, CPU cores, GPUs, DSPs, ASICs, mixed-signal integrated circuits, FPGAs, microcontrollers, programmable logic controllers (PLCs), programmable logic device (PLDs), complex PLDs (CPLDs), systems on a chip (SoC), any subsection of any of the above, an interconnected or distributed combination of any of the above, or any other integrated or discrete logic circuitry, or any other type of component or one or more components capable of being configured in accordance with any of the examples disclosed herein.

As used in this disclosure, circuitry may also include one or more memory devices, such as any volatile or non-volatile media, such as a RAM, ROM, non-volatile RAM (NVRAM), electrically erasable programmable ROM (EEPROM), flash memory, and the like. The one or more memory devices may store computer-readable instructions that, when executed or processed the circuitry, cause the circuitry to implement the techniques attributed herein to circuitry. The circuitry of this disclosure may be programmed, or otherwise controlled, with various forms of firmware and/or software.

Various illustrative aspects of the disclosure have been described above. These and other aspects are within the scope of the following claims.

The invention claimed is:

1. A device for performing a write operation using a spintronic Hall effect, the device comprising:
   a Spin Hall Effect (SHE) structure;
   a Magnetic Tunnel Junction (MTJ) element, the MTJ element comprising a free structure, a pinned structure, and a tunnel barrier arranged between the free structure and the pinned structure, wherein the free structure comprises a plurality of free layers and wherein the free structure is arranged with the SHE structure such that current in the SHE structure induces spin transfer into the free structure; and
   processing circuitry configured to:
      receive an instruction to set the MTJ element to a target state of a plurality of states; and
      in response to receiving the instruction, generate electrical current through the SHE structure to modify a resistance of the MTJ element to correspond to the target state.

2. The device of claim 1, wherein the plurality of free layers comprises a first free layer and a second free layer and wherein the free structure further comprises:
an anti-ferromagnetic coupling layer, wherein the anti-ferromagnetic coupling layer is arranged between the first free layer and the second free layer.

3. The device of claim 2, wherein the anti-ferromagnetic coupling layer is a first anti-ferromagnetic coupling layer, wherein the plurality of free layers further comprises a third free layer, and wherein the free structure further comprises:
a second anti-ferromagnetic coupling layer, wherein the second anti-ferromagnetic coupling layer is arranged between the second free layer and the third free layer.

4. The device of claim 1, wherein the pinned structure includes one pinned layer.

5. The device of claim 1, wherein the processing circuitry is configured to:
perform a read operation on the MTJ element using a magneto-resistance of MTJ element; and
output a result of the read operation.

6. The device of claim 5, wherein, to perform the read operation, the processing circuitry is configured to:
determine a state of the MTJ element is in a parallel magnetization state in response to determining the magneto-resistance at the MTJ element is less than a threshold resistance; and
determine the state of the MTJ element is in an anti-parallel magnetization state in response to determining the magneto-resistance at the MTJ element is not less than a threshold resistance.

7. The device of claim 6, further comprising:
a switching element electrically coupled to the pinned structure;
wherein the SHE structure, the MTJ element, and the switching element form a series string; and
wherein the processing circuitry is configured to:
apply a read voltage across the series string;
detect a sense voltage across the switching element while applying the read voltage across the series string;
determine the magneto-resistance at the MTJ element is less than the threshold resistance in response to the sense voltage being greater than a voltage threshold; and
determine the magneto-resistance at the MTJ element is not less than the threshold resistance in response to the sense voltage being not being greater than the voltage threshold.

8. The device of claim 1,
wherein the free structure is arranged with a bottom surface of the SHE structure; or
wherein the free structure is arranged with a top surface of the SHE structure.

9. The device of claim 1,
wherein the free structure is arranged with a side surface of the SHE structure and wherein the tunnel barrier is arranged below a bottom surface of the SHE structure; or
wherein the free structure is arranged with a side surface of the SHE structure and wherein the tunnel barrier is arranged above a top surface of the SHE structure.

10. The device of claim 1, wherein the MTJ element is a first MTJ element, wherein the free structure is a first free structure, the pinned structure is a first pinned structure, and the tunnel barrier is a first tunnel barrier, the device further comprising:

a second MTJ element, the second MTJ element comprising a second free structure, a second pinned structure, and a second tunnel barrier arranged between the second free structure and the second pinned structure and wherein the second free structure is arranged with the SHE structure such that current in the SHE structure induces spin transfer into the second free structure.

11. The device of claim 10, wherein the processing circuitry further configured to:
receive an instruction to set the second MTJ element to a target state of the plurality of states; and
in response to receiving the instruction, generate electrical current through the SHE structure to modify a resistance of the second MTJ element to correspond to the target state.

12. The device of claim 10,
wherein the first MTJ element is arranged on a bottom surface of the SHE structure and wherein the second MTJ element is arranged on the bottom surface of the SHE structure;
wherein the first MTJ element is arranged on a top surface of the SHE structure and wherein the second MTJ element is arranged on the bottom surface of the SHE structure; or
wherein the first MTJ element is arranged on the top surface of the SHE structure and wherein the second MTJ element is arranged on the top surface of the SHE structure.

13. The device of claim 1, wherein the SHE structure comprises an antiferromagnetic material.

14. A method for performing a write operation using a spintronic Hall effect, the method comprising:
receiving, by processing circuitry, an instruction to set a Magnetic Tunnel Junction (MTJ) element to a target state of a plurality of states, the MTJ element comprising a free structure, a pinned structure, and a tunnel barrier arranged between the free structure and the pinned structure, wherein the free structure comprises a plurality of free layers and wherein the free structure is arranged with the Spin Hall Effect (SHE) structure such that current in the SHE structure induces spin transfer into the free structure; and
in response to receiving the instruction, generating, by processing circuitry, electrical current through the spin Hall effect structure to modify a resistance of the MTJ element to correspond to the target state.

15. The method of claim 14, wherein the plurality of free layers comprises a first free layer and a second free layer and wherein the free structure further comprises:
an anti-ferromagnetic coupling layer, wherein the anti-ferromagnetic coupling layer is arranged between the first free layer and the second free layer.

16. The method of claim 15, wherein the anti-ferromagnetic coupling layer is a first anti-ferromagnetic coupling layer, wherein the plurality of free layers further comprises a third free layer, and wherein the free structure further comprises:
a second anti-ferromagnetic coupling layer, wherein the second anti-ferromagnetic coupling layer is arranged between the second free layer and the third free layer.

17. The method of claim 14, wherein the pinned structure includes one pinned layer.

18. The method of claim 14, further comprising:
performing, by the processing circuitry, a read operation on the MTJ element using a switching element electrically coupled to the pinned structure; and outputting, by the processing circuitry, a result of the read operation.

19. The method of claim 18, wherein performing the read operation comprises:
- determining a state of the MTJ element is in a parallel magnetization state in response to determining a resistance at the MTJ element is less than a threshold resistance; and
- determining the state of the MTJ element is in an anti-parallel magnetization state in response to determining the resistance at the MTJ element is not less than a threshold resistance.

20. A device for performing a write operation, the device comprising:
- means for receiving an instruction to set a Magnetic Tunnel Junction (MTJ) element to a target state of a plurality of states, the MTJ element comprising a free structure, a pinned structure, and a tunnel barrier arranged between the free structure and the pinned structure, wherein the free structure comprises a plurality of free layers and wherein the free structure is arranged with the Spin Hall Effect (SHE) structure such that current in the SHE structure induces spin transfer into the free structure; and
- means for generating electrical current through the spin Hall effect structure to modify a resistance of the MTJ element to correspond to the target state in response to receiving the instruction.

* * * * *